United States Patent [19]

Metzner et al.

[11] Patent Number: 5,657,331

[45] Date of Patent: Aug. 12, 1997

[54] METHOD AND APPARATUS FOR THE GENERATION OF SIMPLE BURST ERROR CORRECTING CYCLIC CODES FOR USE IN BURST ERROR TRAPPING DECODERS

[75] Inventors: John J. Metzner, Pond Lab #319, University Park, Pa. 16802; Young-tae Cha, 105-505, Inkye-dong, Paldal-gu, Suwon-city, Kyungki-do, Rep. of Korea

[73] Assignees: Samsung Electronics Co., Ltd., Kyungki-do, Rep. of Korea; a part interest; John J. Metzner, University Park, Pa.; a part interest; Young-Tae Cha, Kyungki-do, Rep. of Korea

[21] Appl. No.: 402,174

[22] Filed: Mar. 13, 1995

[51] Int. Cl.$^6$ .................... B60Q 1/06; F21M 3/18; F21P 5/00; F21V 21/00

[52] U.S. Cl. .................... 371/39.1; 371/38.1

[58] Field of Search .................... 371/37.1, 37.6, 371/38.1, 39.1, 40.1

[56] References Cited

U.S. PATENT DOCUMENTS

| | | | |
|---|---|---|---|
| 3,811,108 | 5/1974 | Howell | 371/39.1 |
| 4,566,105 | 1/1986 | Oisel et al. | 371/37.5 |
| 4,631,725 | 12/1986 | Takamura et al. | 371/37.1 |
| 4,916,702 | 4/1990 | Burlekamp | 371/39.1 |
| 5,381,423 | 1/1995 | Turco | 371/39.1 |

OTHER PUBLICATIONS

Error Correcting Codes – Second Edition by Peterson and Weldon, The MIT Press, pp. 42–47 1972.

*Primary Examiner*—Reba I. Elmore
*Assistant Examiner*—Robert J. Dolan
*Attorney, Agent, or Firm*—Rothwell, Figg, Ernst & Kurz, P.C.

[57] ABSTRACT

A technique deals with wide classes of cyclic codes for simple burst trapping decoding of almost all bursts of length which approaches twice the maximum guaranteed burst length correcting capability with good burst error correcting and detecting capability. The vector symbol codes achieve the highest burst correcting capability but use very long codes. "Perfect" codes can correct all bursts up to length t, and almost all bursts of length l, where $t+1 \leq l \leq n-k-t$, with less than $n2^{-(t-1)}$ incorrect decoding probability for an n-bit code. The probability of an undetected error for any length burst is less than $n2^{-(t-1)}$. Shortened "perfect" codes can detect any burst of a double or triple error pattern.

34 Claims, 2 Drawing Sheets

METHOD AND APPARATUS FOR THE GENERATION OF SIMPLE BURST ERROR CORRECTING CYCLIC CODES FOR USE IN BURST ERROR TRAPPING DECODERS

BACKGROUND OF THE INVENTION

This invention relates to simple burst error correcting cyclic codes and the generation method thereof for use in a burst error trapping decoder, which can dramatically enhance burst error correcting capability of existing burst correcting cyclic codes with a simple decoding method. Particularly, this invention relates to simple burst error correcting cyclic codes and the generation method thereof for use in a burst error trapping decoder, for correction of bursts up to nearly twice the guaranteed correction bound.

Although many coding techniques have been developed for channels on which transmission errors occur independently in digit positions, communication channels such as telephone lines can be affected by lightning strikes or man-made electrical disturbances that cause transmission errors to cluster into bursts. Since random error correcting codes are inefficient for correcting such burst errors, it is desirable to design codes specifically for correcting burst errors. Codes of this kind are called burst error correcting codes.

Cyclic codes are effective not only for burst error detection but also for burst error correction. Various effective cyclic codes for correcting burst errors have been proposed over the past twenty years.

For cyclic codes, the correction of all bursts within the guaranteed Reiger burst error correcting capability of the code is accomplished with a simple burst error trapping method using a feedback shift register (reference *Error Control Coding: Fundamentals and Applications* by S. Lin and D. J. Costello, Jr., Prentice-Hall, 1983). It has also been recognized that with a high degree of confidence a very large proportion of bursts of a length well beyond the guaranteed burst error correcting capability can be corrected, but with greater difficulty. The simplest general method finds the shortest burst having a given syndrome (reference pp 291–297 of *Information Theory and Reliable Communication* by R. G. Gallager, Wiley, 1968). The Gallager scheme requires two passes through shift registers: one to find the shortest burst and the other to do the correction thereon. This method is significantly more complex than burst error trapping, however, which performs the decoding in one pass. Another method corrects bursts beyond the guaranteed correctable bound using Reed-Solomon codes (reference "A Burst-Error Algorithm for Reed-Solomon Codes" by J. Chen and P. Owsley, in IEEE *Transactions on Information Theory*, pp 1807–1812, November 1992). Decoding Reed-Solomon codes is also considerably more complex than burst error trapping. The number of check symbols was an absolute bound on burst error correction capability with any satisfactory degree of confidence.

Referring to FIG. 1 showing a burst error trapping decoder for burst error correcting codes, a decoding operation of single burst error correcting cyclic codes will be described in more detail below.

As shown in FIG. 1, an l-burst-error-correcting cyclic code can be most easily decoded by the error-trapping technique, with a slight variation. Suppose that a code word v(X) from an l-burst-error-correcting (n, k) cyclic code is transmitted. Let r(X) and e(X) be the received and error vectors, respectively, and let $$s(X)=s_0+s_1X+\ldots+s_{n-k-1}X^{n-k-1}$$

be the syndrome of r(X). Then, if the errors in e(X) are confined to the l higher-order parity-check digit positions $X^{n-k-l},\ldots,X^{n-k-2}$ and $X^{n-k-1}$ of r(X), the l higher-order syndrome digits $S_{n-k-l},\ldots,S_{n-k-2}$ and $s_{n-k-1}$ match the errors of e(X) and the n-k-l lower-order syndrome digits $s_0, s_1,\ldots$ and $s_{n-k-l-1}$ are zeros. Suppose that the errors in e(X) are not confined to the positions $X^{n-k-l},\ldots,X^{n-k-2}$ and $X^{n-k-1}$ of r(X) but are confined to l consecutive positions of r(X) (including the end-around case). Then, after a certain number of cyclic shifts of r(X), say, i cyclic shifts, the errors will be shifted to the positions $X^{n-k-l},\ldots,X^{n-k-2}$ and $X^{n-k-1}$ of $r^{(i)}(X)$, the ith shift of r(X). Let $s^{(i)}(X)$ be the syndrome of $r^{(i)}(X)$. Then, the first l higher-order digits of $s^{(i)}(X)$ match the errors at the positions $X^{n-k-l},\ldots,X^{n-k-2}$ and $X^{n-k-1}$ of $r^{(i)}(X)$, and the n-k-l lower-order digits of $s^{(i)}(X)$ are zeros. Using these facts, the errors in the syndrome register can be trapped by cyclic-shifting r(X).

In the error trapping decoder for an l-burst-error-correcting cyclic code shown in FIG. 1, the received vector is shifted into the syndrome register from the left end. The decoding procedure is described in the following steps:

Step 1. The received vector r(X) is shifted into the syndrome register and buffer register simultaneously. If it is not desired to decode the received parity check digits, the buffer register needs only k stages. As soon as r(X) has been shifted into the syndrome register, the syndrome s(X) is formed.

Step 2. The syndrome register starts to shift with gate 2 on. As soon as its n-k-l leftmost stages contain only zeros, its l rightmost stages contain the burst error pattern and the error correction begins. There are three cases to be considered.

Step 3. If the n-k-l leftmost stages of the syndrome register contain all zeros after the ith shift (for $0 \leq i \leq n-k-l$), the errors of the burst e(X) are confined to the parity check positions of r(X). In this event, the k received information digits in the buffer register are error-free. Gate 4 is then activated and the k error-free information digits in the buffer are shifted out to the data sink. If the n-k-l leftmost stages of the syndrome register never contain all zeros during the first n-k-l shifts of the syndrome register, the error burst is not confined to the n-k parity-check positions of r(X).

Step 4. If the n-k-l leftmost stages of the syndrome register contain all zeros after the (n-k-l+i)th shift of the syndrome register for $1 \leq i \leq l$, the error burst is confined to positions $X^{n-i},\ldots,X^{n-1},X^0,\ldots$, and $X^{l-i-1}$ of r(X). This is an end-around burst. In this event, the l-i digits contained in the l-i rightmost stages of the syndrome register match the errors at the parity check positions $X^0, X^1, \ldots$, and $X^{l-i-1}$ of r(X), and the i digits contained in the next i stages of the syndrome register match the errors at the positions $X^{n-i},\ldots,X^{n-2}$ and $X^{n-1}$ of r(X). At this instant, a clock starts to count from (n-k-l+i+1). The syndrome register is then shifted (in step with the clock) with gate 2 turned off. As soon as the clock has counted up to n-k, the i rightmost digits in the syndrome register match the errors at the positions $X^{n-i},\ldots,X^{n-2}$ and $X^{n-1}$ of r(X). Gates 3 and 4 are then activated. The received information digits are read out of the buffer register and corrected by the error digits shifted out from the syndrome register.

Step 5. If the n-k-l leftmost stages of the syndrome register never contains all zeros by the time that the syndrome register has been shifted n-k times, the received information digits are read out of the buffer register one at a time with gate 4 activated. At the same time, the syndrome register is shifted with gate 2 activated. As soon as the n-k-l leftmost stages of the syndrome register contain all zeros, the digits in the l rightmost stages of the syndrome register match the errors in the next l received information digits to come out of the buffer register. Gate 3 is then activated and the erroneous information digits are corrected by the digits coming out from the syndrome register with gate 2 disabled.

If the n–k–l stages of the syndrome register never contain all zeros by the time the k information digits have been read out of the buffer, an uncorrectable burst of errors has been detected. With the prior-art burst error trapping decoder described above, the decoding process takes 2n clock cycles; the first n clock cycles are required for syndrome computation and the next n clock cycles are needed for error trapping and error correction. The n clock cycles for syndrome computation are concurrent with the reception of the received vector from the channel; that is, no time delay occurs in this operation. The second n clock cycles for error trapping and correction represent a decoding delay.

In the decoder using the above-described decoding procedure, the received vector is shifted into the syndrome register from the left end. If the received vector is shifted into the syndrome register from the right end, the decoding operation would be slightly different.

This decoder corrects only burst errors of length l or less. The number of these burst error patterns is $n2^{l-1}$, which, for a large n value, is only a small fraction of $2^{n-k}$ correctable error patterns (the coset leaders).

It is possible to modify the decoder in such a way that it corrects all the correctable burst errors of length n–k or less. That is, besides correcting all the bursts of length l or less, the decoder also corrects those bursts of length l+1 to n–k which are used as coset leaders. This modified decoder operates as follows. The entire received vector is first shifted into the syndrome register. Before performing the error correction, the syndrome register is cyclically shifted n times (with feedback connections operative). During this cycling, the length b of the shortest burst that appears in the b rightmost stages of the syndrome register is recorded by a counter. This burst is assumed to be the error burst added by the channel. Having completed these pre-correction shifts, the decoder begins its correction process. The syndrome register starts to shift again. As soon as the shortest burst reappears in the b rightmost stages of the syndrome register, the decoder starts to make corrections as described earlier. This decoding is a well-known optimum decoding method for burst-error-correcting codes, which was proposed by Gallager.

However, as shown in FIG. 2, when the conventional cyclic codes are used, the test bit area in the (n–k)-stage syndrome register occupies more than half of the total number of the syndrome bits by the Reiger bound. Accordingly, the burst error correctable area cannot be extended.

SUMMARY OF THE INVENTION

Therefore, to solve the above conventional problems, it is an object of the present invention to provide a method for generating a simple burst error correcting cyclic code capable of extending burst error correction capability up to nearly twice the guaranteed correction bound.

It is another object of the present invention to provide a method for generating a burst error correcting cyclic code for simple burst error trapping decoding of almost all bursts of a predetermined length, which approaches twice the maximum guaranteed burst error correcting capability.

It is still another object of the present invention to provide a method for generating a burst error correcting cyclic code for simple burst error trapping decoding of all bursts up to a predetermined length t and almost all bursts of a predetermined length l, where $t+1 \leq l \leq n-k-t$, with less than an $n2^{-(r-1)}$ incorrect decoding probability for an (n, k) cyclic code, which approaches twice the maximum guaranteed burst error correcting capability, in which n is a total length of the cyclic code and k is the number of information bits.

It is a further object of the present invention to provide a burst error trapping decoder for burst error correcting codes, in which twice the bound on guaranteed burst capability is possible.

It is still a further object of the present invention to provide a method that can correct burst errors up to close to twice the guaranteed Reiger bound, by using an ordinary burst error trapping method, but without significant sacrifice in decoding reliability.

According to one aspect of the present invention, a method is provided to generate a simple burst error correcting cyclic code having a predetermined value which is obtained by adding one to the maximum number of consecutive zeros in a parity check polynomial, the predetermined value being the smallest integer such that a sub-matrix $p_1T$ of a parity check matrix does not have a column of all zeros among each generator polynomial of an (n, k) cyclic code in which n is the total length of the cyclic code and k is the number of information bits.

Another aspect of the present invention is accomplished by generating a simple burst error correcting cyclic code having a code length n and information bits k, so that every set of a predetermined number t of consecutive columns of a sub-matrix of a parity check matrix is linearly independent for each generator polynomial g(x) where the number of rows of the sub-matrix of the parity check matrix is a predetermined number y.

Still another aspect of the present invention is accomplished by generating a simple burst error correcting cyclic code determined by a generator polynomial g(x) of an (n–i, k–i) cyclic code in which n–i is code length, k–i is the number of information bits and i is the number of shortened bits, the simple burst error correcting cyclic code having a value of the code length n–i so that every set of a predetermined number of consecutive columns of a sub-matrix of a parity check matrix is linearly independent for each generator polynomial g(x).

Yet another aspect of the present invention is accomplished by providing a method for generating a burst error correcting cyclic code determined by a generator polynomial g(x) of an (n, k) cyclic code in which n is code length and k is the number of information bits, the method comprising the step of obtaining a predetermined value by adding one to the maximum number of consecutive zeros in a parity check polynomial when the value is the smallest integer such that a sub-matrix $p_1T$ of a parity check matrix does not have a column of all zeros among each generator polynomial of the cyclic code.

Still yet another aspect of the present invention is accomplished by providing a method for generating a simple burst error correcting cyclic code having a code length n and information bits k, so that every set of a predetermined number t of consecutive columns of a sub-matrix of a parity check matrix is linearly independent for each generator polynomial g(x) where the number of rows of the sub-matrix of the parity check matrix is a predetermined number y.

A further aspect of the present invention is accomplished by providing a method for generating a simple burst error correcting cyclic code determined by a generator polynomial g(x) of an (n–i, k–i) cyclic code in which n–i is code length, k–i is the number of information bits and i is the number of shortened bits, the simple burst error correcting cyclic code having a value of the code length n–i so that every set of a predetermined number of consecutive columns of a sub-matrix of a parity check matrix is linearly independent for each generator polynomial g(x).

Still a further aspect of the present invention is accomplished by providing a burst error trapping decoder comprising a syndrome register portion for forming a syndrome s(X) and a buffer register portion for storing an information digit, both of which receive an input vector r(X), the burst error trapping decoder comprising the improvement wherein the syndrome register portion comprises a plurality of serially connected shift registers of which the feedback connection tap points are determined by using a simple burst error correcting cyclic code having a predetermined value which is obtained by adding one to the maximum number of consecutive zeros in a parity check polynomial, the predetermined value being the smallest integer such that a sub-matrix $p_1T$ of a parity check matrix does not have a column of all zeros among each generator polynomial of the cyclic code.

Still yet a further aspect of the present invention is accomplished by providing a burst error trapping decoder comprising a syndrome register portion for forming a syndrome s(X) and a buffer register portion for storing an information digit, both of which receive an input vector r(X), the burst error trapping decoder comprising the improvement wherein the syndrome register portion comprises a plurality of serially connected shift registers of which the feedback connection tap points are determined by using a simple burst error correcting cyclic code having a code length n and information bits k, so that every set of a predetermined number t of consecutive columns of a sub-matrix of a parity check matrix is linearly independent for each generator polynomial g(x) where the number of rows of the sub-matrix of the parity check matrix is a predetermined number y.

One more aspect of the present invention is accomplished by providing a burst error trapping decoder comprising a syndrome register portion for forming a syndrome s(X) and a buffer register portion for storing an information digit, both of which receive an input vector r(X), the burst error trapping decoder comprising the improvement wherein the syndrome register comprises a plurality of serially connected shift registers of which the feedback connection tap points are determined by using a simple burst error correcting cyclic code determined by a generator polynomial g(x) of an (n–i, k–i) cyclic code in which n–i is code length, k–i is the number of information bits and i is the number of shortened bits, the simple burst error correcting cyclic code having a value of the code length n–i so that every set of a predetermined number of consecutive columns of a sub-matrix of a parity check matrix is linearly independent for each generator polynomial g(x).

BRIEF DESCRIPTION OF THE DRAWING

The above objects and advantages of the present invention will become more apparent by describing in detail preferred embodiments thereof with reference to the attached drawings in which:

FIG. 5 shows part of a burst trapping decoding circuit embodied when m=1 in a perfect code of class 5a.

DETAILED DESCRIPTION OF THE INVENTION

Basic concepts and operations according to preferred embodiments of the present invention will be described below in more detail with reference to the accompanying drawings.

Figure 1:
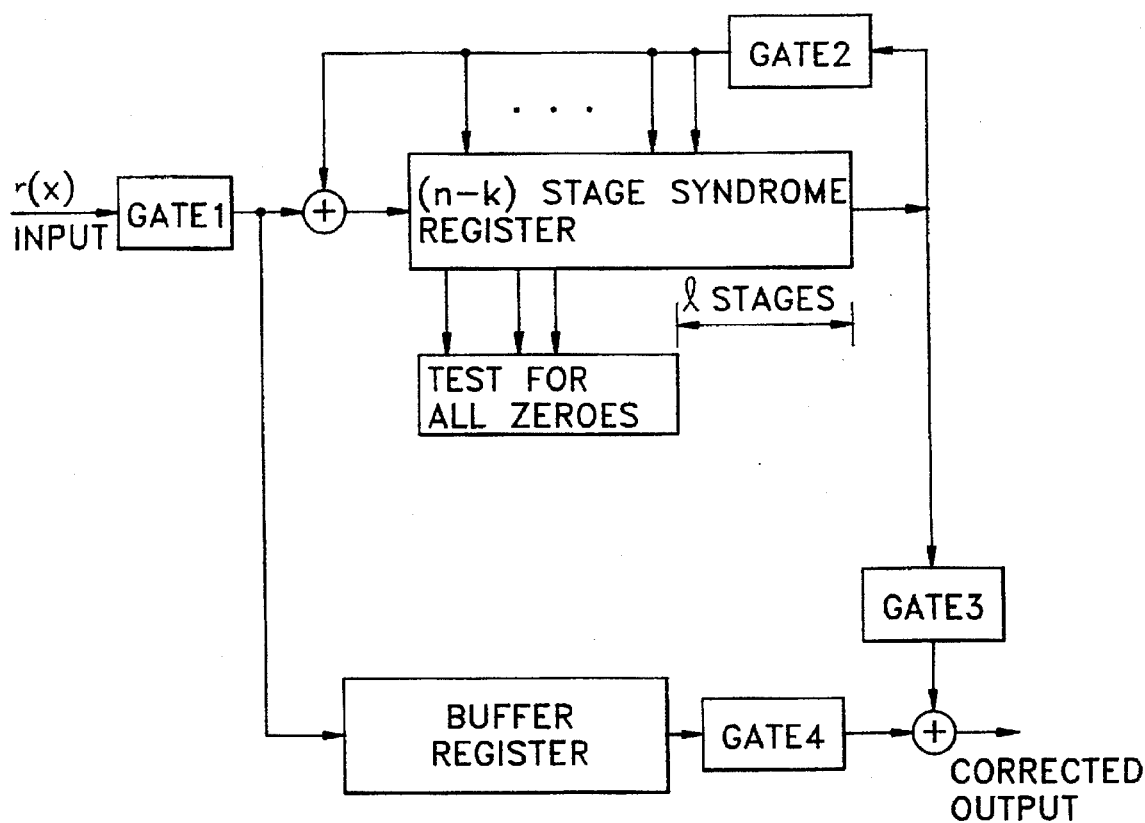
FIG. 1 is a circuit diagram of a conventional burst trapping decoder using a general burst error correcting cyclic code.
Figure 2:
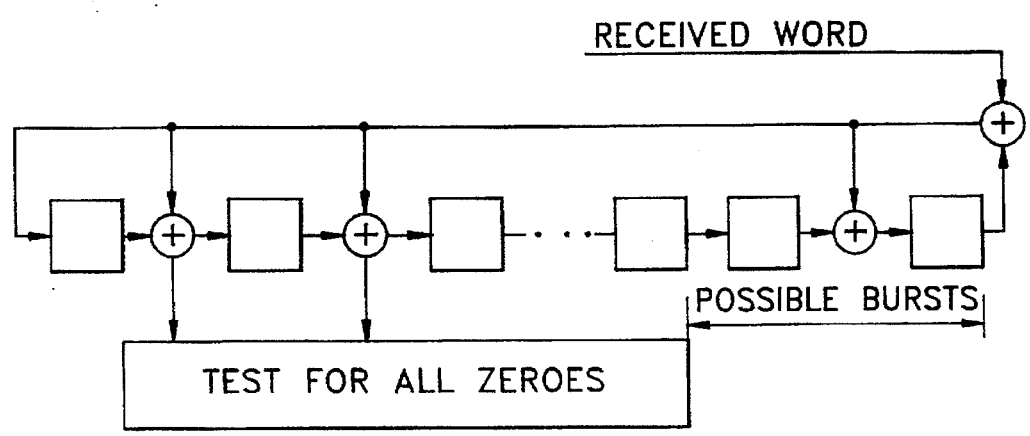
FIG. 2 is a view for explaining the drawbacks of the conventional burst trapping decoder when using a general burst error correcting cyclic code.

First of all, burst error correcting codes which can be used for simply designing the syndrome register in the burst error trapping decoder as shown in FIG. 1 will be described below. Here, three burst error correcting codes are disclosed; namely, a vector symbol code, a perfect code and a shortened perfect code, which will be described in sequence.

I. A Class of (n, n/2–1) Vector Symbol Codes

Let a symbol be an r-bit vector, and let H be the parity check matrix of an (n, k) binary cyclic code. A class of rate (n, n/2–1) codes with n r-bit symbols (n being even) can be found which is capable of correcting almost all error bursts that are confined to at most n/2 consecutive r-bit blocks, using a simple form of burst trapping. The generator and parity polynomials g(x) and h(x) for this class of codes are $$g(x)=(x^{n/2}+1)(x+1) \qquad (1)$$

$$h(x)=x^{(n/2-1)}+ \ldots \text{(all 1's coefficients)} \ldots +1$$

For example, consider n=10. If we write the H matrix in systematic form, the syndrome computation is $$S = \begin{bmatrix} s_0 \\ s_1 \\ \cdot \\ \cdot \\ \cdot \\ s_5 \end{bmatrix} = HE = \begin{bmatrix} 1 & 1 & 1 & 1 & 1 & 0 & 0 & 0 & 0 & 0 \\ 1 & 0 & 0 & 0 & 0 & 1 & 0 & 0 & 0 & 0 \\ 0 & 1 & 0 & 0 & 0 & 0 & 1 & 0 & 0 & 0 \\ 0 & 0 & 1 & 0 & 0 & 0 & 0 & 1 & 0 & 0 \\ 0 & 0 & 0 & 1 & 0 & 0 & 0 & 0 & 1 & 0 \\ 1 & 1 & 1 & 1 & 0 & 0 & 0 & 0 & 0 & 1 \end{bmatrix} \begin{bmatrix} e_0 \\ e_1 \\ \cdot \\ \cdot \\ \cdot \\ e_9 \end{bmatrix} \qquad (2)$$

where $s_i$ and $e_i$ are r-bit row vectors. Note that a burst in blocks $e_5$ through $e_9$ will make $s_0$ a zero vector and $s_1$ to $s_5$ the true error pattern. Also, errors in blocks $e_0$ through $e_4$ will not make $s_0$ a zero vector if they are linearly independent. This feature is true for any even value of n because the choice of h(x) ensures that the first row of H starts with n/2 consecutive ones. A burst trapping decoding rule can be made based on a simple feedback shift register to compute the syndrome (see FIGS. 3 through 5) as follows:

If the first syndrome vector is not zero, the error trapping process (right shifting) begins using a feedback shift register until the first syndrome vector is a zero vector. If the first syndrome vector is a zero vector, the true error values are retrieved from the last n–k–1 syndrome vectors.

Figure 3:
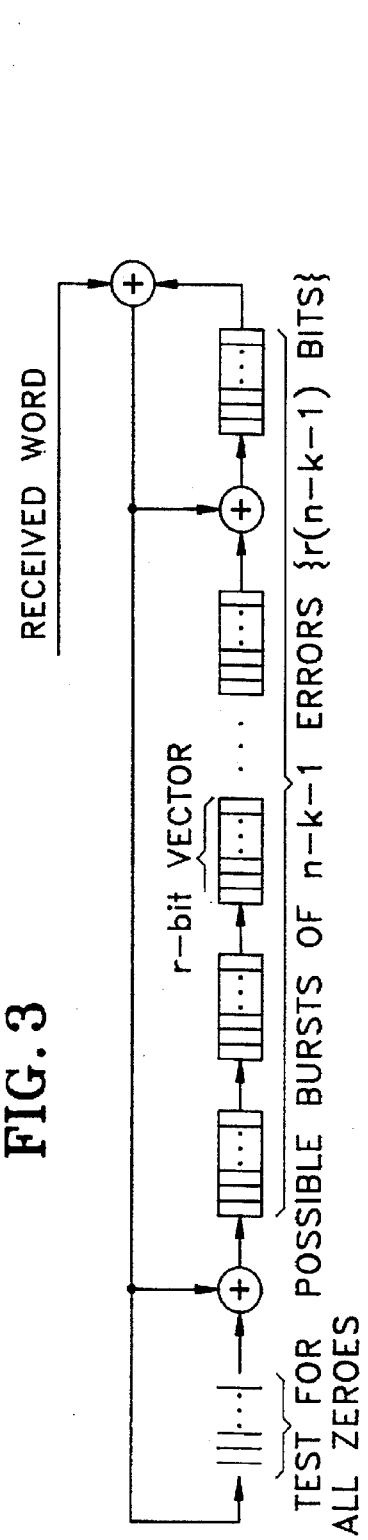
FIG. 3 shows part of a burst trapping decoding circuit, for a class of (n, n/2–1) vector symbol codes.

This burst trapping decoding rule needs up to nr shifts (testing once per r shifts) to cover cyclic bursts if the serial decoder in FIG. 3 is used. The decoding can be reduced to n shifts if a parallel decoder is used.

The decoding result sometimes may not be correct if the error vectors are linearly dependent, but it has been shown that if t r-tuple error patterns are random and statistically independent with a bit error probability of ½, the probability of their being linearly dependent decreases exponentially with r and is approximately $2^{-(r-t)}$ (reference "A General Decoding Technique Applicable to Replicated File Disagreement Location and Concatenated Code Decoding" by J. J. Metzher and E. J. Kapturowski, IEEE *Transactions on Information Theory*, pp 911–917, July 1990). The actual probability of an undetected error is highly dependent on how the vector symbols are sent physically as well as the channel characteristics. Here, the vector symbols can be inner symbols with their own error correction, or modulation codes might be used. On the other hand, the technique described in the above paper by Metznet et al. can be used to transform vector symbols prior to transmission in such a way as to make residual vector symbol error patterns pseudorandom and approximately statistically independent. Another way of providing adequate error detection is to replace one of the data vectors with a cyclic redundancy check (CRC) of the data, and send the "corrected" message through a CRC checker to see if the correction was performed correctly.

The vector symbol codes in this section are restricted to a rate slightly less than ½. The next section will show how to extend the idea to codes of a higher rate.

II. Vector Symbol Codes of a Higher Rate

Consider a cyclic code with a parity check matrix of $H=[P^T\ I_{n-k}]$. Then, the syndrome can be formed as follows:

$$S = \begin{bmatrix} s_0 \\ s_1 \\ \vdots \\ s_{y-1} \\ \vdots \\ s_{n-k-1} \end{bmatrix} = HE = \begin{bmatrix} P_1^T & I_y & 0 \\ P_2^T & 0 & I_{n-k-y} \end{bmatrix} \begin{bmatrix} e_0 \\ e_1 \\ \vdots \\ e_{k+y-1} \\ \vdots \\ e_{n-1} \end{bmatrix} \quad (3)$$

where $I_y$ is where a y×y identity matrix, P is a k×(n-k) matrix, and $s_i$ and $e_i$ are r-bit row vectors.

This section examines the extendibility of the almost all burst error correcting capability to a wider class of cyclic codes and code rates by accepting a reduction from a burst length of n-k-1 blocks to that of n-k-y blocks. If the last n-k-y positions for a burst is tested for y consecutive zero syndrome vectors $s_0, s_1, \ldots,$ and $s_{y-1}$, it is then desirable that the probability be small so that any error outside the test range will fail to be detected. If one of the columns of $p_1T$ is all zeroes, an error in the symbol position will not be detected. If no column of $p_1T$ is all zeroes, any single error and any set of linearly independent vector symbol errors will be detected (as well as most other cases). To minimize y for maximum burst error correcting capability, let y be the smallest value such that $p_1T$ does not have a column of all zeroes.

First, it is demonstrated that the value of y depends on the maximum number of consecutive zeroes in the h(x) polynomial. Then, some additional general classes of codes with good burst correction capability are shown. Also, an exhaustive computer search was made for good codes, and a list of these is given in Table 1 which shows a summary of good vector symbol codes for the cases of 22 or fewer check symbols.

TABLE 1

| number of check symbols | burst capability | (n, k) | generator polynomials, in octal (class) |
|---|---|---|---|
| 8 | 7 | 14, 6 | 603(1a) |
|  | 6 | 24, 16 | 653 |
|  | 6 | 21, 13 | 575, 513 |
| 9 | 8 | 16, 7 | 1403(1a) |
|  | 7 | 28, 19 | 1205(2b) |
|  | 7 | 21, 12 | 1607(2a) |
| 10 | 9 | 18, 8 | 3003(1a) |
|  | 8 | 24, 14 | 3407(2a), 3567 |
| 11 | 10 | 20, 9 | 6003(1a) |
|  | 9 | 36, 25 | 5005(2b) |
|  | 9 | 30, 19 | 5775 |
|  | 8 | 56, 45 | 5413 |
|  | 8 | 48, 37 | 4411 |
| 12 | 11 | 22, 10 | 14003(1a) |
|  | 10 | 30, 18 | 16007(2a), 12245, 16347 |
|  | 9 | 68, 56 | 16247 |
|  | 9 | 63, 51 | 15015, 14343 |
|  | 9 | 45, 33 | 12765 |
|  | 9 | 36, 24 | 17017(3) |
| 13 | 12 | 24, 11 | 30003(1a) |
|  | 11 | 44, 31 | 24005(2b) |
|  | 11 | 33, 20 | 34007(2a) |
|  | 10 | 70, 57 | 22067, 26013 |
|  | 10 | 63, 50 | 24445, 31747 |
|  | 10 | 60, 47 | 22011, 36757 |
|  | 10 | 48, 35 | 26445 |
| 14 | 13 | 26, 12 | 60003(1a) |
|  | 12 | 42, 28 | 65253, 65567 |
|  | 12 | 39, 25 | 57775 |
|  | 12 | 36, 22 | 55055 |
|  | 12 | 30, 16 | 54503 |
|  | 11 | 77, 63 | 54013 |
|  | 11 | 66, 52 | 44011 |
|  | 11 | 60, 46 | 47151 |
|  | 11 | 55, 41 | 53765 |
|  | 11 | 44, 30 | 74017(3) |
| 15 | 14 | 28, 13 | 140003(1a) |
|  | 13 | 52, 37 | 120005(2b) |
|  | 13 | 39, 24 | 160007(2a) |
|  | 12 | 84, 69 | 110231, 114455, 130013, 135447 |
|  | 12 | 63, 48 | 166717 |
|  | 12 | 60, 45 | 162317, 167357 |
|  | 12 | 56, 41 | 115731, 132743, 143655, |
|  | 12 | 48, 33 | 166667 |
|  | 12 | 42, 27 | 131347, 163515 114631, 136675 114675, 116273, 131223 |
| 16 | 15 | 13, 14 | 300003(1a) |
|  | 14 | 42, 26 | 241205, 340007(2a) |
|  | 13 | 91, 75 | 260013 |
|  | 13 | 90, 74 | 347347 |
|  | 13 | 80, 64 | 367357 |
|  | 13 | 78, 62 | 220011 |
|  | 13 | 72, 56 | 231231 |
|  | 13 | 65, 49 | 303703 |
|  | 13 | 63, 47 | 227075, 241673 |
|  | 13 | 60, 44 | 244367, 272135 |
|  | 13 | 52, 36 | 360017(3) |
|  | 13 | 51, 35 | 225043, 322513 |
| 17 | 16 | 32, 15 | 600003(1a) |
|  | 15 | 60, 43 | 500005(2b) |
|  | 14 | 112, 95 | 452527 |
|  | 14 | 105, 88 | 477773 |
|  | 14 | 84, 67 | 440011, 567127, 743617 |
|  | 14 | 70, 53 | 537765 |
|  | 14 | 62, 45 | 450127, 650647 |
| 18 | 17 | 34, 16 | 1400003(1a) |
|  | 16 | 48, 30 | 1600007(2a) |
|  | 16 | 36, 18 | 1525253, 1666667 |
|  | 15 | 105, 87 | 1100451, 1300013 |
|  | 15 | 90, 72 | 1335443, 1424243 |
|  | 15 | 78, 60 | 1372117 |
|  | 15 | 72, 54 | 1716717 |
|  | 15 | 63, 45 | 1105523, 1145113, 1146365 1230013, 1265023, 1413107 |

TABLE 1-continued

| number of check symbols | burst capability | (n, k) | generator polynomials, in octal (class) |
|---|---|---|---|
|  | 15 | 60, 42 | 1434617 1122451, 1165715, 1215373 1477763, 1700017(3) |
|  | 15 | 56, 38 | 1175513 |
|  | 15 | 51, 33 | 1377775, 1657727 |
| 19 | 18 | 36, 17 | 3000003(1a) |
|  | 17 | 68, 49 | 2400005(2b) |
|  | 17 | 51, 32 | 3400007(2a) |
|  | 17 | 42, 23 | 2637723 |
|  | 16 | 112, 93 | 2600013 |
|  | 16 | 102, 83 | 2754675 |
|  | 16 | 96, 77 | 2200011 |
|  | 16 | 80, 61 | 2577765 |
|  | 16 | 72, 53 | 2333331, 3564567 |
| 20 | 19 | 38, 18 | 6000003(1a) |
|  | 18 | 72, 52 | 5550555 |
|  | 18 | 60, 40 | 6525253 |
|  | 18 | 57, 37 | 5777775, 6247123 |
|  | 18 | 54, 34 | 5005005 |
|  | 17 | 119, 99 | 6400015 |
|  | 17 | 102, 82 | 4400011 |
|  | 17 | 90, 70 | 6252523 |
|  | 17 | 85, 65 | 5517455 |
|  | 17 | 84, 64 | 4612431, 4773043, 5106673 |
| 21 | 20 | 40, 19 | 14000003(1a) |
|  | 19 | 76, 55 | 12000005(2b) |
|  | 19 | 60, 39 | 12260645 |
|  | 19 | 48, 27 | 13226455 |
|  | 18 | 126, | 11444455, 12301313, 13000013 |
|  | 18 | 105 | 17017017 |
|  | 18 | 108, 87 | 12313013, 12602447, 16666667 |
|  | 18 | 84, 63 | 12757365 |
|  |  | 80, 59 |  |
| 22 | 21 | 42, 20 | 30000003(1a) |
|  | 20 | 60, 38 | 24500245, 32673553, 34016007 34000007(2a) |
|  | 20 | 50, 28 | 24512245 |
|  | 20 | 48, 26 | 34073407, 35673567 |
|  | 19 | 133, | 26000013 |
|  | 19 | 111 | 24030327 |
|  | 19 | 126, | 35273527 |
|  | 19 | 104 | 22000011 |
|  | 19 | 120, 98 | 22762631, 33416073 |
|  | 19 | 114, 92 | 25777765 |
|  | 19 | 105, 83 | 25611723 |
|  | 19 | 95, 73 | 22720757, 23333331, 25417713 |
|  |  | 93, 71 | 27640575, 26375423 |
|  | 19 | 84, 62 | 36000017(3) |
|  | 19 |  | 23312331 |
|  | 19 | 76, 54 | 23311773 |
|  | 19 | 72, 50 | 24621145, 35552667 |
|  | 19 | 60, 48 | 23714423, 24570147, 30364007 |
|  | 19 | 66, 44 | 22761751, 24763727, 25634775 |
|  |  | 63, 41 | 30416267, 34273507 |
|  |  | 62, 40 |  |

Theorem 1

For a given (n, k) cyclic code, let y be the smallest integer such that $p_1T$ does not have a column of all zeroes. Then, y is one more than the maximum number of consecutive zeroes in the h(x) polynomial.

Proof

The first k positions of row 1 are $h(x)-h_0$. Suppose a string of j zeroes between two ones appears in positions i through i+j−1. The first k positions of row 2 are obtained by just shifting row 1 to the right if $h_1=0$, or by shifting row 1 to the right and adding $h(x)-h_0$ vector modulo two to the first k-shifted positions if $h_1=1$. Row 2 now will have a one in position i, since the shift puts a one there, and even if $h_1=1$, $h(x)-h_0$ has a zero in position i. Row 2 will have a string of j−1 zeroes in positions i+1 through i+j−1, since the shift will not place a one there, and $h(x)-h_0$, even if added, will have zeroes in all these positions.

The next row (shift) will similarly have a one in position i+1 and a string of j−2 zeroes in positions i+2 through i+j−1, since both rows 1 and 2 have zeroes in positions i+1 through i+j−1, and even if they are added, they do not affect these positions. Continuing, j shifts will be needed to get a one into all of the positions of this zero string. The number of shifts to ensure every position has a one in at least one row is thus the maximum number of consecutive zeroes, and the number of rows is one more than this when row 1 is included.

Theorem 2

If an (n, k) cyclic code with g(x) is found which corrects almost all bursts errors up to b blocks in length, a (2n, 2k) cyclic code with $g(x^2)$ can correct almost all bursts errors up to 2b blocks in length.

Proof

The (2n, 2k) code will have $h(x^2)$ as its check polynomial. Then, supposing the maximum string of zeroes of h(x) falls between the power i and power j positions, the spacing between the power i and power j positions is j−i−1. Accordingly, the spacing between the power 2i and power 2j positions of $h(x^2)$ is 2j−2i−1. Thus, initially, $$y = (j-i-1)+1$$
$$= j-i$$

and for the (2n, 2k) code, $$y' = (2j-2i-1)+1$$
$$= 2(j-i)$$

and $$b' = 2(n-k)-y'$$
$$= 2(n-k-y)$$
$$= 2b$$

The object in searching for good codes, then, is to look for cyclic codes whose h(x) polynomial has the minimum number of consecutive zero coefficients. Good codes have been found through the discovery of certain classes of codes and by an exhaustive computer search.

Class of "Good" Vector Symbol Codes a) y=1

The class (n, n/2−1), n being even, which has already been discussed will be called class 1a. There are no codes of a rate greater than ½ that have the y=1 property except the trivial case of one check symbol. This is because h(x), expressed thus $$h(x) = 1+x+x^2+\ldots\text{(all terms)}\ldots+x^k$$
$$= (x^{k+1}+1)/(x+1)$$

must be a factor of $x^n+1$, which requires n to be a multiple of k+1. There are other classes of codes with a rate less than ½ and having the y=1 property, but these are of limited interest because of the low rate. One class which may be worth mentioning is (n, n/4−1), n being a multiple of four, with a generator polynomial of $$g(x)=(x^{n/2}+1)(x^{n/4}+1)(x+1) \qquad (4)$$

Almost all burst up to 3n/4 symbols can be corrected by this code, and the rate approaches ¼. This class will be called class 1b.

b) y=2

Class 2a is a class of codes (n, 2n/3−2) for all n>9 such that n is a multiple of three but not a multiple of nine. The generator polynomial is $$g(x) = (x^{n/3}+1)(x^2+x+1) \quad (5)$$
$$= (x^{n/3}+1)(x^3+1)(x+1)$$

To verify this, note that if there is an (n, 2n/3−2) cyclic code with this generator polynomial, there is an h(x) for which the following expression is true.

$$h(x) = (x^n+1)(x+1)/(x^{n/3}+1)(x^3+1) \quad (6)$$
$$= (x^{2n/3}+x^{n/3}+1)/(x^2+x+1)$$

Here, $x^2+x+1$ has roots $\alpha=t$ and $\alpha^2=t+1$ in GF(4) modulo $1+t+t^2$. If n is a multiple of nine, $x^{2n/3}+x^{n/3}+1$ does not have these roots, so there is no such cyclic code. If n is a multiple of three but not a multiple of nine, $x^{2n/3}+x^{n/3}+1$ does have these roots, and the code is cyclic. Note that $1/(x^2+x+1)$ is the period 3 repetitive pattern 110 110 110 . . . . Multiplying this pattern by $x^{2n/3}+x^{n/3}+1$, it is easy to verify that if n/3 is not a multiple of three, h(x) has no string of two consecutive zeroes, but has at least one zero. For n=6, $g(x)=(x+1)(x^3+1)$ and $h(x)=x^2+x+1$, which is a class 1a code. Here, n=3 is meaningless.

Class 2a codes have rates asymptotically approaching ⅔ and correct almost all bursts up to n/3 vector symbols.

Class 2b is a class of codes (n, 3n/4−2) for all n>8 such that n is a multiple of four but not a multiple of eight. The generator polynomial is $$g(x)=(x^{n/4}+1)(x^2+1) \quad (7)$$

To verify this, note that if there is an (n, 3n/4−2) cyclic code with this generator polynomial, there is an h(x) for which $$h(x)=(x^n+1)/(x^{n/4}+1)(x^2+1) \quad (8)$$

Since n is a multiple of four, $$x^n+1 = (x^{n/4}+1)^4 \quad (9)$$
and
$$h(x) = (x^{n/4}+1)(x^{n/2}+1)/(x^2+1)$$
$$= (x^{n/4}+1)(1+x^2+x^4+\ldots+x^{n/2-2})$$

In equation 9, the last parenthetical term is the alternating sequence: 1010101 . . . 01.

If n/4 is odd, the added shifted term coming from multiplying by $x^{n/4}$ creates an h(x) with the pattern 1010 . . . 1011111 . . . 11010 . . . 101, having at most one consecutive zero. If n/4 is even, however, the sum introduces a string of zeroes in the center. Thus, n cannot be a multiple of eight.

Class 2b codes have rates asymptotically approaching ¾ and correct almost all burst errors up to n/4 vector symbols in length.

c) y=3

Class 3 consists of (n, 3n/4−3) codes for all n>16 such that n is a multiple of four but not a multiple of sixteen. The generator polynomial is expressed as follows.

$$g(x) = (x^{n/4}+1)(x^3+x^2+x+1) \quad (10)$$
$$= (x^{n/4}+1)(x^4+1)/(x+1)$$

This code is of rate approaching ¾ and corrects almost all bursts of length up to n/4. To verify this, note that $$h(x) = (x^n+1)(x+1)/(x^{n/4}+1)(x^4+1) \quad (11)$$
$$= (x^{3n/4}+x^{2n/4}+x^{n/4}+1)(x+1)/(x^4+1)$$

and $(x+1)/(x^4+1)$ corresponds to the following repetitive pattern.
1100 1100 1100 1100 1100 . . .

If n/4 is a multiple of four, the $x^{n/4}$ shift term will introduce four consecutive zeroes in the n/4 to (n/4)+3 degree term positions, which will violate the requirement of there being no more than two consecutive zeroes.

If n/4 is not a multiple of four, the $x^{n/4}$ shift term will not add to zeroes in the positions n/4 to (n/4)+3.

(i) n/4=4k+1

| | |
|---|---|
| $x^0$ term: | 1100 1100 . . . 1100 1100 1100 . . . |
| $x^{n/4}$ term: | 110 0110 0110 . . . |
| sum: | 1100 1100 . . . 1010 1010 1010 . . . 1010 1010 1010 . . . |
| $x^{2n/4}$ term: | 11 0011 0011 . . . |
| sum: | 1100 1100 . . . 1010 1010 1010 . . . 1001 1001 1001 . . . |

Note that the sum of the three contributions still has no more than two consecutive zeroes. The $x^{3n/4}$ shift term does not kick in until after the end of h(x) at $x^{(3n/4)-3}$, after which the infinite tail is cancelled.

| | |
|---|---|
| $x^0$ term: | 1100 1100 . . . 1100 1100 1100 . . . |
| $x^{n/4}$ term: | 11 0011 0011 . . . |
| sum: | 1100 1100 . . . 1111 1111 1111 . . . 1111 1111 1111 . . . |
| $x^{2n/4}$ term: | 1100 1100 1100 . . . |
| sum: | 1100 1100 . . . 1111 1111 1111 . . . 0011 0011 0011 . . . |

Note again that the sum of the three contributions still has no more than two consecutive zeroes.

| | |
|---|---|
| $x^0$ term: | 1100 1100 . . . 1100 1100 1100 . . . |
| $x^{n/4}$ term: | 1 1001 1001 . . . |
| sum: | 1100 1100 . . . 1101 0101 0101 . . . 0101 0101 0101 . . . |
| $x^{2n/4}$ term: | 0011 0011 0011 . . . |
| sum: | 1100 1100 . . . 1101 0101 0101 . . . 0110 0110 0110 . . . |

Again, no more than two consecutive zeroes are present.

With the three known classes at rates approaching ½, ⅔ and ¾, and theorem 2 that allows doubling the code length while keeping the same rate and the same proportion of burst correcting capability to number of check symbols, a wide range of good codes is available. All of these codes require only simple burst trapping for error correction.

Code by Computer Search

A computer search was made for all the best codes of a length less than 150 and a rate greater than ½, for each number of check symbols up to 22. This could readily be extended, but the number of computations goes up exponentially with the number of check symbols. The best codes and their generator polynomials are shown in the above Table 1. Where g(x) is not symmetrical, an equivalent reciprocal polynomial exists but is not shown. Class 1a is also included in Table 1. Codes with y=3 that have a lower rate than a y=2 code are not shown. Codes in classes 1a, 2a, 2b and 3 are indicated in parentheses. Note that whenever the number of check symbols is odd, the class 2b code is always the highest rate code in the y=2 category. Also, the class 2a code is the second highest rate for y=2 when both 2a and 2b exist for that number of check symbols and is the highest rate when 2a exists but 2b does not. The class 3 codes are not especially outstanding and do not always make the list.

For the simplest circuitry, the number of feedback connections should be as small as possible. Classes 1a and 2b both require only three feedback connections, while class 2a requires five. Most other codes on the list require a considerably greater number of feedback connections.

From the computer results, it can be seen that a wide range of good codes is available. All of these codes require almost the same simple burst trapping for error correction. If the parameter is y, the decoding test is for the first y symbols in the register to be all zeroes, in which case the pattern in the other n−k−y blocks is taken to be the error pattern and is subtracted from the received sequence. The limit of burst correcting capability is the number of check symbols minus y.

Probability of False Burst Correction

False burst correction will not occur in vector symbol codes if all the vector errors are linearly independent. However, false burst error correction rarely will occur even if this condition is not met.

a) y=1

In a given test position, a false reading will be obtained only if the sum of the error vectors outside the test region is zero. Obviously, a single error outside the test region will be detected. If i error vectors are selected in the test region, the last one chosen must be equal to the sum of the others in order not to be detected. If the sum of the others is nonzero and the error vector patterns to be random and statistically independent are taken, the probability of false error correction is $1/(2^r-1)$; if the sum of the others is zero, the probability is zero. Thus, using the union bound, for n test positions, $n/(2^r-1)$ is an upper bound on the probability of false error correction if the vector error patterns are random and statistically independent.

A false reading will be obtained if there are exactly two error vectors outside the burst test range and they are identical. This is usually the case of greatest risk when the assumption of random statistically independent vector error patterns is invalid. If we knew the error statistics, the probability of exactly two identical error patterns appearing in the k+1 test positions of each shift could be computed.

b) y>1

Again, the presence of a single error outside of the burst test range is always detected. Two symbol errors outside the test range are detected if they are not equal, and even if they are equal, they will be detected unless the two corresponding columns of $p_1T$ are identical.

Three symbol errors will be detected if they are rank 3, or if two errors are identical (e.g., a, a, b) because at least one check will contain b, which cannot be cancelled and will not be detected if and only if:

i) they are identical and the positions pattern is in the null space of the row space of $p_1T$ or ii) if rank 2 and sum of the three symbol errors is zero, and three corresponding columns of $p_1T$ are identical.

In general, i symbol errors of rank i−1 will be always detected if the dependency involves less than i positions, since there will always be a check equation which includes one not in the dependency and which cannot be cancelled. They will not be detected if the dependency relation involves all i positions and the i corresponding columns of $p_1T$ are identical. If the i symbol errors are of a rank less than i−1, the enumeration is more complex, but this is a less likely event.

Other cases could be investigated, but they are less likely in most applications. The most likely undetected error event would usually be that there are two identical errors and the corresponding columns of $p_1T$ are identical. Of course, this case could not occur if the columns of $p_1T$ are all different, but for small values of y this would not be true.

Figure 4:
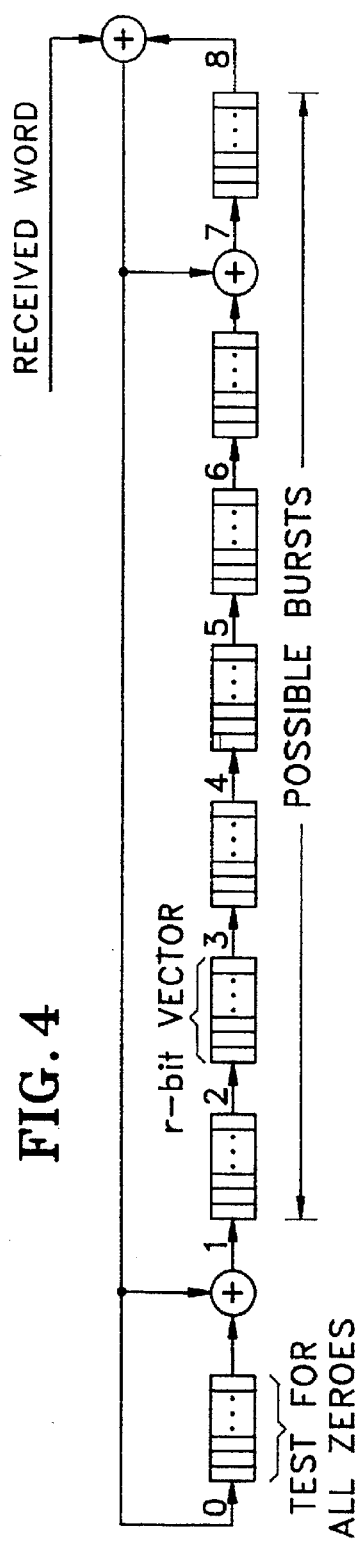
FIG. 4 shows part of a burst trapping decoding circuit constituted according to a specific value 603 of the generator polynomial of a vector symbol code in Table 1.

FIG. 4 shows part of a burst trapping decoding circuit constituted according to a specific value 603 of the generator polynomial of a vector symbol code in Table 1, for explaining the merit of the present invention. FIG. 4 shows the syndrome portion of the burst trapping decoder shown in FIG. 1. The generator polynomial value 603 is expressed as binary coded digits 110 000 011. That is, since the generator polynomial is expressed as $x^8+x^7+x+1$, the syndrome register is constituted by using eight shift-register groups, three adders and a received word input. In this embodiment, each shift-register group includes a predetermined number of shift registers to form an r-bit vector. As shown in FIG. 4, the region of possible bursts is extended since the region of the test for all zeroes is reduced. Further, the vector symbol codes of the present invention facilitates a design of the burst error trapping decoder.

III. Perfect Codes

Perfect codes eliminate the need of the division into r-bit blocks in vector symbol codes, and correct almost all bursts of a length up to n−k−y bits. Consider the syndrome vector of any cyclic code:

$$s = \begin{bmatrix} s_0 \\ s_1 \\ \cdot \\ \cdot \\ s_{y-1} \\ \cdot \\ \cdot \\ s_{n-k-1} \end{bmatrix} = He = \begin{bmatrix} p_1^T & I_y & 0 \\ p_2^T & 0 & I_{n-k-y} \end{bmatrix} \begin{bmatrix} e_0 \\ e_1 \\ \cdot \\ \cdot \\ e_{k+y-1} \\ \cdot \\ \cdot \\ e_{n-1} \end{bmatrix} \quad (12)$$

where $I_y$ is a yxy identity matrix, $p_1T$ is a kxy matrix, and $s_i$ and $e_i$ are scalar. The decoding algorithm for correcting almost all bursts up to length n−k−y is the following burst trapping method:

If the first y syndrome bits are zero, the true error values are retrieved from the last n−k−y syndrome bits.

The proposed decoding method is the same as the conventional burst trapping method except the proposed method tests much fewer syndrome bits and corrects larger bursts than the conventional burst trapping method. However, the performance of the proposed decoding method depends critically on the error detection capability of the parity check sub-matrix $[P_1T I_y]$, which will be denoted as $H_y$ hereinafter. If, by the error detection capability of $H_y$, a high degree of confidence exist that there is no error in the first k+y positions, the last n−k−y syndromes can be regarded as the true error values.

An error pattern in the first k+y positions is not detected by the first y syndromes if it is in the null space of the row space of $H_y$. There are a total of $2^{k+y}$ possible error patterns. Among these, $2^k$ patterns are in the null space of the row space of $H_y$. Thus, only a fraction of $2^{-y}$ of all error patterns is not detected and results in incorrect decoding. Moreover, it is desirable to ensure that the probability that common errors such as short bursts go undetected is also small. The next theorem describes the error detection capability of $H_y$.

Theorem 3

If every set of t consecutive columns of the parity check sub-matrix $H_y$ is linearly independent, the burst detecting capability in the first k+y positions is as follows:

(1) any burst up to length t is detected, (2) the fraction of undetectable bursts of length l (=t+1) is less than or equal to $2^{-(t-1)}$, and (3) the fraction of undetectable bursts of length l (>t+1) is less than or equal to $2^{-t}$.

Proof

Since every set of t consecutive columns of $H_y$ is linearly independent, it is evident that no burst up to length t in the first k+y positions goes undetected. If the length of a burst is t+1, the following equation should be satisfied for the error pattern to be undetected:

$$e_i p_i + e_{i+1} p_{i+1} + \ldots + e_{i+t} p_{i+t} = 0 \quad (13)$$

where $e_i$ and $e_{i+t}$ are both equal to one since they are the first and last bits of a (t+1)-length burst, and $P_{i+j}$ (where j is an integer from 0 to t) are the corresponding column vectors of $H_y$. Thus, $$[p_{i+1} \, p_{i+2} \cdots p_{i+t-1}] \begin{bmatrix} e_{i+1} \\ e_{i+2} \\ \cdot \\ \cdot \\ \cdot \\ e_{i+t-1} \end{bmatrix} = p_i + p_{i+t} \quad (14)$$

where $[p_{i+1} \, p_{i+2} \cdots p_{i+t-1}]$ is of rank t−1. If $p_i + p_{i+t}$ is in the column space of $p_{i+1}, p_{i+2}, \ldots$, and $p_{i+t-1}$, a unique solution exists in equation 14 and makes one undetectable error pattern. Otherwise, no error pattern satisfies equation 14. There are a total of $2^{t-1}$ such patterns of length t−1 at a particular position, and only one or no error pattern is undetected. For the entire first k+y positions, the same argument applies and the fraction of undetectable burst patterns of length t+1 is less than or equal to $2^{-(t-1)}$. Note that the equality holds when y=t. This is because $p_i + p_{i+t}$ is always in the column space of $p_{i+1}, p_{i+2}, \ldots$, and $p_{i+t-1}$ when y=t. If $p_{i+t}$ is represented as a linear combination of $p_i, p_{i+1}, \ldots$, and $p_{i+t-1}$ which span the space of t-tuples, the coefficient of $p_i$ should be one. If it is not one, $p_{i+t}$ is in the column space of $p_{i+1}, p_{i+2}, \ldots$, and $p_{i+t-1}$ and contradicts the assumption.

If the length l of a burst is greater than t+1, the following equation should be satisfied for the error pattern to be undetected:

$$[p_{i+1} \, p_{i+2} \cdots p_{i+t}] \begin{bmatrix} e_{i+1} \\ e_{i+2} \\ \cdot \\ \cdot \\ \cdot \\ e_{i+t} \end{bmatrix} = \quad (15)$$

$$p_i + p_{i+l-1} + e_{i+l+1} p_{i+l+1} + e_{i+l+2} p_{i+l+2} + \ldots + e_{i+l-2} p_i$$

There are $2^{l-t-2}$ patterns for the right hand side of equation 15 according to $e_{i+t+1}, e_{i+t+2}, \ldots$, and $e_{i+l-2}$. If the right hand side of equation 15 is in the column space of $p_{i+1}, p_{i+2}, \ldots$, $p_{i+t}$, one solution for $e_{i+1}, e_{i+2}, \ldots$, and $e_{i+t}$ exists out of the $2^t$ arrangements for each corresponding $e_{i+t+1}, e_{i+t+2}, \ldots$, and $e_{i+l-2}$ pattern. There are a total of $2^{l-2}$ burst patterns of length l (>t+1). Thus, a fraction of at most $2^{l-t}$ (i.e., $2^{l-t-2}/2^{l-2}$) of these bursts are not detected. The equality holds when y=t, since $p_{i+1}, p_{i+2}, \ldots$, and $p_{i+t}$ span the space of t-tuples.

Theorem 3 suggests good burst correcting characteristics. If the length of a burst is less than or equal to t, the length of a burst in the first k+y positions should also be less than or equal to t for any cyclic shift of the received word, and thus, any burst up to length t is always corrected. For a burst of a length greater than t, it is assumed that all bursts of the same length are equally likely. Since n shifts are needed to cover all cyclic bursts, the incorrect decoding probability (Pr) for a burst of any length can be upper-bounded using a union bound as follows:

$$\Pr \leq n 2^{-(t-1)}$$

Since the largest t value is desired for a given n−k−y, t would be equal to or close to y. If t equals y, we will call such codes "perfect". However, the question remains as to how to construct such codes for a large t value. Theorem 4 gives a clue for a systematic way to construct a class of cyclic codes for a large t value.

Theorem 4

If an (n, k) cyclic code with g(x) has the property that every set of t consecutive columns of $H_y$ is linearly independent, a (2n, 2k) cyclic code with $g(x^2)$ has the property that every set of 2t consecutive columns of the corresponding parity check sub-matrix $H'_{2y}$ is linearly independent.

Proof

The (2n, 2k) code will have $h(x^2)$ as its parity check polynomial. The first 2y rows of the nonsystematic parity check matrix are j shifts of $h(x^2)$, where j is an integer from 0 to 2y−1. In this 2y×(2k+2y) parity check sub-matrix, any column vector in an odd position is linearly independent to a set of column vectors in even positions, which can be easily seen from the fact that the set has no nonzero element in a same position since all the odd degree terms of $h(x^2)$ are zeroes. Also, any set of column vectors in t consecutive odd (or even) positions is linearly independent since any t consecutive column vectors of $H_y$ is linearly independent.

Since a set of elementary row operations can change the nonsystematic matrix to the systematic form, and elementary row operations do not change the column rank, any 2t consecutive columns of $H'_{2y}$ are linearly independent.

The object in searching for good codes, then, is to look for perfect or nearly perfect cyclic codes for a small t value. When a (nearly) perfect code is found, theorem 4 can be used to generate additional (nearly) perfect codes with larger values of t. Wide classes of perfect codes for small t values have been found by further refining the codes in section III and an exhaustive computer search.

Classes of Perfect Burst Correcting Codes a) Codes of a rate approaching ½

Consider an (n, n/2−t) cyclic code, n being even, with a generator polynomial $$g(x) = (x^{n/2}+1) g_1(x) \quad (16)$$

where $g_1(x)$ is any polynomial of degree t for dividing $x^{n/2}+1$. Every t consecutive columns of $H_t$ of this code is linearly independent. The corresponding parity polynomial h(x) satisfies both $g(x)h(x) = x^n+1$ and $g_1(x)h(x) = x^{n/2}+1 = x^{k+t}+1$, and the parity check sub-matrix $H_t$ is the parity check matrix of a (k+t, k) cyclic code. Thus, every t consecutive columns of $H_t$ is linearly independent due to the nature of cyclic codes. If not, there should be a code word in terms of $g_1(x)$, which has nonzero components only, in less than or equal to t consecutive positions; but this is impossible since all code words of a (k+t, k) cyclic code are multiples of $g_1(x)$ which is of degree t. This class of codes is called class 4a.

The case when t=1 deserves special attention since it belongs to the class 1a codes, and yields the highest rate among class 4a codes.

There are other classes of perfect codes with rates less than ½, but these are of limited interest because of the low rate. One class which may be worth mentioning is (n, n/4−t), n being a multiple of four, with a generator polynomial $$g(x)=(x^{n/2}+1)(x^{n/4}+1)g_1(x) \qquad (17)$$

where $g_1(x)$ is any polynomial of degree t for dividing $x^{n/4}+1$. Every t consecutive columns of $H_t$ of this code are linearly independent. This class is called class 4b.

b) Codes of a rate approaching ⅔.

Class 5a is a class of (n, 2n/3−2) codes, for n=9m+3 where m is a positive integer. The generator polynomial is expressed as follows.

$$\begin{aligned}g(x) &= (x^{n/3}+1)(x^2+x+1) \\ &= (x^{n/3}+1)(x^3+1)/(x+1)\end{aligned} \qquad (18)$$

Every two consecutive columns of $H_2$ of this code are linearly independent. To verify this, we note that if there is an (n, 2n/3−2) cyclic code with this generator polynomial (equation 18), there is an h(x) for which $$h(x)=(x^n+1)/(x^{n/3}+1)(x^2+x+1) \qquad (19)$$

and since n is a multiple of three, the following can be derived.

$$h(x)=(x^{2n/3}+x^{n/3}+1)/(x^2+x+1) \qquad (20)$$

Here, since $1/(x^2+x+1)$ is the period 3 repetitive pattern of 110 110 110 ..., the following calculations are obtainable.

| | | |
|---|---|---|
| $x^0$ term: | 110 110 ... 110 110 110 ... | |
| $x^{n/3}$ term: | 11 011 011 0 ... | |
| sum: | 110 110 ... 101 101 101 ... | 101 101 101 ... |
| $x^{2n/3}$ term: | | 1 101 101 1 ... |
| sum: | 110 110 ... 101 101 101 ... | 101 100 000 000 000 ... |

Since h(x) has only one consecutive zero and two consecutive ones, it can be easily noticed that every two consecutive columns of $H_2$, which is the first two rows and 2n/3 columns of the parity check matrix, are linearly independent.

Class 5b is a class of (n, 2n/3−2) codes, for n=18m+6 where m is a positive integer. The generator polynomial is expressed as follows.

$$g(x)=(x^{n/3}+x^{n/6}+1)(x^2+x+1) \qquad (21)$$

Every two consecutive columns of $H_2$ of this code are linearly independent. To verify this, we note that if there is an (n, 2n/3−2) cyclic code with this generator polynomial, there is an h(x) for which the following is true.

$$h(x)=(x^n+1)/(x^{n/3}+x^{n/6}+1)(x^2+x+1) \qquad (22)$$

Since n is a multiple of six, we can say that $$\begin{aligned}h(x) &= (x^{n/2}+1)/(x^{n/6}+1)/(x^2+x+1) \\ &= (x^{2n/3}+x^{n/2}+x^{n/6}+1)/(x^2+x+1)\end{aligned} \qquad (23)$$

and thus,

| | | | |
|---|---|---|---|
| $x^0$ term: | 110 110 ... 110 110 110 ... | | |
| $x^{n/6}$ term: | 11 011 011 0 ... | | |
| sum: | 110 110 ... 101 101 101 ... | 101 101 101 ... | |
| $x^{n/2}$ term: | | 110 110 11 ... | |
| sum: | 110 110 ... 101 101 101 ... | 101 011 011 011 ... | 011 011 011 011 ... |
| $x^{2n/3}$ term: | | | 11 011 011 011 ... |
| sum: | 110 110 ... 101 101 101 ... | 101 011 011 011 ... | |

Here, h(x) has only one consecutive zero and two consecutive ones, and every two consecutive columns of $H_2$ are linearly independent.

Class 5c is a class of (n, 2n/3−3) codes, for n=30 m where m is a positive integer but not a multiple of three. The generator polynomial is expressed as follows.

$$g(xl)=(i\ x^{n/3}+1)(x^4+x^3+1)/(x+1) \qquad (24)$$

Every set of four consecutive columns of $H_4$ of this code is linearly independent. This can be verified using a Gauss-Jordan reduction with a computer. It is also interesting that if m is a multiple of three, the above generator polynomial yields lower rate codes. The generator polynomial should be rewritten as $$g(x)=(x^{n/2}+1)(x^4+x^3+1)/(x+1) \qquad (25)$$

and makes a class of (n, n/2−3) codes, for n=60 m where m is a positive integer. Every four consecutive columns of $H_4$ of this code is linearly independent.

c) Other rate codes

Class 6 consists of (n, 4n/5−5) codes, for n=100 m+60 where m is a whole number. The generator polynomial is expressed as follows.

$$g(x)=(x^{n/5}+1)(x^5+1)/(x^4+1) \qquad (26)$$

Class 6 codes are the highest rate perfect codes we know of, and every four consecutive columns of $H_4$ of this class of codes are linearly independent. It is interesting that if n=40 m (where m is a positive integer), lower rate (n, n/2−1) codes exist. The generator polynomial is $$g(x)=(x^{n/2}+1)(x^5+1)/(x^4+1) \qquad (27)$$

and every four consecutive columns of $H_4$ of this code are linearly independent.

A computer search was made for all the perfect codes of a length less than 150, a rate greater than ½, and satisfies t≦7, for each number of check symbols up to 21. The search procedure uses a Gauss-Jordan reduction for each t consecutive columns of $H_y$ to see whether it is of full rank. The perfect codes and their generator polynomials that are not included in the mentioned classes are shown in Table 2. Where g(x) is not symmetrical, an equivalent reciprocal polynomial exists but is not shown.

An example of the above computer program is as follows.

```
/* This program is to find the burst error detecting
   capability for all cyclic codes with deg(g(x))<n_check+1 by
   Gauss-Kordan method.
*/ include <stdio.h>
include <stdlib.h>
# define trace 1 /* trace 1 is the lowest option to print */
main()
{
  static int g[100], inf[500], h[500], test[10][10],input[15];
  int i, j, k, m, deg_h=500, deg_g, k_inf, n_len, rate, n_row,
      w_test, posi, n_check, n_input;
  char name[30], c;

int max_length, carry;
  char decode, sh_cy, final='F';

FILE *fopen(), *fpw;
  fpw=fopen("ksol.1", "w");

n_row =6;
  w_test =6;

/*initialize*/
  for (j=0; j<=100; j++) g[j]=0;

deg_g=15;
  g[0]=g[deg_g]=1;

n_check=23;
```

```
            printf(" \n n_row= %d, n_row);
            printf(" \n w_test= %d", w_test);

fprintf(fpw, "\n n_row= %d, n_row);
            fprintf(fpw, " \n w_test= %d", w_test);

5        do {
               carry=1; j=0;
               while(carry==1)  {
                  j++;
                  if(g[j]==1)   {g[j]=0; carry=1;}
  10            else {g[j]=1; carry=0;}
            }
            if(f>deg_g)  {deg_g=j;
              printf("\n\n   # of check bits = %d", deg_g);
              fprintf(fpw, "\n\n   # of check bits = %d", deg_g);}

15        /* if (trace >= 2) printpoly(g, deg_g, "g(x)   1";*/

/* find corresponding h(x) */
               /* h[0] is always 1 */
               inf[0]=1; m=150;
               for (j=1; j<=m; j++) inf[j]=0;
  20           for (j=0; j<=m; j++) h[j]=0;
               j=0; final='F';
               while(final == 'F' && j <=m) {
                  if(inf[j]==1)   {
                     k=0;
  25                 h[j]=1; deg_h=j;
                     for(i=j; i<=j+deg_g; i++) inf[i]=pl(inf[i], g[i-j]);
            /*     if(trace >=2) printpoly(inf, i_1, "inf");
            */   }
                  j++;
  30              k++;
                  if(k==deg_g) {/* --this is for primitive block length */
                  final='T'; sh_cy='F';
                  /*printf(" primitive block length is %d \n", i-1); */
                  }
  35        }
            if (trace >=1) printpoly(h, deg_h, "h(x)   1");
            if(final =='F') sh_cy='T';

if( ((float)(deg_h)/(float)(deg_g+deg_h))>0.5)   { i=j=posi=0;;
  40        final='F';
            while(final =='F)   {
              /*printf (\n\n                   posi=         %3d", posi);*/
              for(i=0; i<=n_row-1; i++)   {
                for(j=0; j<=w_test-1; j++) {
  45              test[i][j]=0;
                  if(posi>=i-j && posi <= deg_h+1)test[i][j]
                     =h[posi+j-1];
              }
                         /*printpoly(test[i], w_test-1, "test"); */
  50        }
```

```
            posi++;
            k=gj(test, n_row, w_test);
             if(trace>=1)printf(\n\n posi= %3d rank yes= %3d",posi,k);

if (k==0)  {
  5            final='N';
               deg_h=posi+w_test-2;
               sh_cy='T';
            }
            else {
 10            if(posi+w_test > deg_h+n_row) {final='T'; sh_cy='F';}
            }
         }
         if(sh_cy=='T') {
             if((float)(deg_h-w_test+1)/(float)(deg_g+deg_h-w_test+1)
 15                >0.5)
               {
                  k=cut_more(h, deg_h, n_row, fpw);
                  printpoly(h, deg_h, "h(x)");
               }
 20         if(k<deg_h) sh_cy='T';
            if((float)(k-w_test+1)/(float)(deg_g+k-w_test+1)>0.5) {
                if (trace >= 1) {
                    output_oct(g, deg_g, fpw);
                      if(sh_cy=='T') fprintf(fpw, "   ---shortened");
 25             }
                if (trace >= 1) printpoly (h, k-w_test+1,
                              "h(x)-ff");
             }
          }
 30      }
      /*} while (g[n_check+1]==0); */
      } cut_more(h, deg_h, n_row, fpw)
      int *h, deg_h, n_row;
 35   FILE *fpw;
      {
         int i, j, k, wk[500], mdf_h, l;
         if(deg_h>=400) printf(*fpw, "dim. error in cut_more");
         mdf_h=deg_h;
 40         if (trace >= 2) printpoly (h, deg_h, "h in cut_more");
         for(i=1; i<=mdf_h; i++){
          for(j=0; j<=mdf_h; j++) wk[j]=h[j];
          for(j=i; j<=mdf_h; j++) wk[j]=pl(wk[j], h[j-i]);
          k=mdf_h;
 45         if (trace >= 2) printpoly (wk, k, "wk in cut_more");
          l=posi_cons_0 (wk, k, n_row);
          if(l!=0) mdf_h=l-1;
             /* printf("   i== %d ", i);
                printf("    l== %d   mdf_h== %d ", l, mdf_h); */
 50      }
         return mdf_h;
      }
```

```
        posi_cons_0 (h, deg_h, cons)
        int *h, deg_h, cons;
    {
        int i=0, j, posi=0, length=0;
 5      char start='n', final='F';
        do  {
            if (start=='n') {
                if (h[i]==0  {length=1; start='y';}
            }
10          else{
                if (h[i]==0  {length=length+1;}
                else{
                    start='n';
                }
15              if (length>=cons) {posi=i; final='T';}
            }
            i++;
        } while (i<=deg_h && final == 'F');
        return posi;
20  } inputconv(g, input, n_input)
    int *g, *input, n_input;
    {
        int i, j;
25      for(i=n_input; i>=0; i--){
            if(input[i]==1||input[i]==3||input[i]==5||input[i]=7)
                {g[(n_input-i)*3]=1; j=(n_input-i)*3;}
            if(input[i]==2||input[i]==3||input[i]==6||input[i]=7)
                {g[(n_input-i)*3+1]=1; j=(n_input-i)*3+1;}
30          if(input[i]==4||input[i]==5||input[i]==6||input[i]=7)
                {g[(n_input-i)*3+2]=1; j=(n_input-i)*3+2;}
        }
        return j;
    }

35      output_oct(g, deg_g, fpw)
        int *g, deg_g;
        FILE *fpw;
        {
            int i, n_oct, oct;
40          n_oct=deg_g/3;
            g[deg_g+1]=g[deg_g+2]=0;
            fprintf(fpw, "  --  ");
            printf( "  --  ");
            for(i=n_oct; i>=0; i--){
45              oct=0;
                if(g[3*i]==1)    oct=oct+1;
                if(g[3*i+1]==1)  oct=oct+2;
                if(g[3*i+2]==1)  oct=oct+4;
                fprintf(fpw, "%d", oct);
50              printf("%d", oct);
```

```
        }
    } gi(test, n_row, w_test)
    int test[10][10], n_row, w_test;
    {
        int i, j, k, l, rank=0;
        char final;
        for(i=0; i<=n_row-1; i++){
           j=0; final='F';
           while(final=='F'  &&  j<=w_test-1){
              if(test[i][j]==1){
                 rank=rank+1;
                 for(k=0; k<=n_row-1; k++){
                    if(k!=i  &&  test[k][j]==1){
                       for(l=0;l<=w_test-1;l++)
                          {test[k][l]=pl(test[k][l], test[i][l]);}
                    }
                 }
                 final='T';
              }
              j++;
           }
        }
        /*for(k=0;k<=n_row-1; k++)
              {printpoly(test[k], w_test-1, "test in gj 22";}*/
        /*printf("\n
    rank=          %2d", rank);*/
        if(rank == w_test) { return 1;}
        else return 0;
    } flprintpoly(g, deg_g, name, fpw)
    int *g, deg_g;
    char name[30];
    FILE   *fpw;
    {
        int i, j, rem, quo;
        fprintf(fpw, "\n *** %s *** degree=%d", name, deg_g);

quo=deg_g / 50; rem=deg_g - 50*quo;
        for (i=0; i<=quo; i++) {
           fprintf(fpw, "\n %d ---", i*50);
           if(i==quo)  {
              for (j=0;j<=rem;j++) fprintf(fpw,"%d",g[i*50+j]);
              /* printf("\n");*/
           }
           else {
              for(j=0;j<=49;j++) fprintf(fpw, "%d", g[i*50+j]);
           }
        }
    }
```

```
printpoly(g, deg_g, name)
int  *g, deg_g;
char name[30];
{
   int i, j, rem, quo;
   printf("\n *** %s ***   degree=%d", name, deg_g);
   quo=deg_g / 50; rem=deg_g - 50*quo;
   for (i=0; i<=quo; i++) {
      printf("\n   %d ---", i*50);
      if(i==quo) {
         for(j=0; j<=rem; j++) printf("%d",g[i*50+j]);
         /* printf("\n");*/
      }
      else {
         for (j=0; j<=49; j++) printf("%d", g[i*50+j]);
      }
   }
}
consecutive_0(h, deg_h)
int *h, deg_h;
{
    int i, j, max_length=0, length=0;
    char start='n';
    for (i=0; i<=deg_h; i++){
        if(start=='n') {
            if (h[i]==0) {length=1; start='y';}
        }
        else{
            if (h[i]==0) {length=length+1;}
            else{
               start='n';
                 if(max_length<=length) max_length=length;
            }
        }
    }
    return max_length;
}
printonly1(g, deg_g, name)
int *g, deg_g;
char name[30];
{
    int j, m, n;
    /*printf("\n *** %s *** degree = %d", name, deg_g);*/
    for (j=0; j<=deg_g; j++) {
       if (g[j]==1) {
          m++;
          printf("%7d",j);
          /* if ((m % 5) ==0) printf("\n");*/
       }
    }
}
polmul(g1, deg_g1, g2, deg_g2, wk)
int  *g1, deg_g1, *g2, deg_g2, *wk;
{
   int i, k, j;
   j=deg_g1 + deg_g2;
```

```
        for(i=0; i<=j; i++)  {
        wk[i]=0;
        for(k=0; k<=i; k++){
            if (k<=deg_g1 && (i-k)<=deg_g2) wk[i]=pl(wk[i],
ml(g1[k], g2[i-k]));
            }
        }
        /* if(trace>=2) printpoly(g2, deg_g2, "g(x) in polmul");
        */ for(i=0; i<=j; i++) g1[i]=wk[i]; return j;
        } pl(a, b)
        int a, b;
        {
            If(a==b)
                return 0;
            else
                return 1;
        } ml(a, b)
        int a, b;
        {
            if(a==1  && b==1)
                return 1;
            else
                return 0;
        } power(a,b)
        int a, b;
        {
            int i, pwr=1;
            for(i=1; i<=b; i++) pwr=pwr*a;
            return pwr;
        }
```

45

TABLE 2

| number of linear independent consecutive columns | (n, k) | generator polynomial (octal) |
|---|---|---|
| 3 | 30, 16 | 67573 |
| 4 | 33, 21 | 17537 |
|   | 60, 42 | 1056427 |
|   | 60, 36 | 245224523 |
| 5 |   | does not exist |
| 6 | 42, 23 | 2637723 |
| 7 |   | does not exist |

IV. Shortened Perfect Codes

In the previous section, it has been described that burst error correcting capability depends critically on burst error detection capability of $H_y$, and if every set of t consecutive columns of $H_y$ is linearly independent, the fraction of undetectable bursts of any length is of the order of $2^{-t}$. Though this is pretty good burst error detecting capability, just two bit errors can defeat the proposed codes if they are properly located. Unfortunately, this is true for all the codes in the previous section, and a perfect cyclic code of a rate greater than ½, and of which $H_y$ has some minimum distance to detect double or triple errors, cannot be found.

To remedy this situation, shortened cyclic codes have been investigated. A shortened cyclic code is determined by the generator polynomial g(x), and the code length n or the number of information bits k. The search procedure is as follows:

Step 1: For each g(x), find the code length n so that every set of t consecutive columns of $H_y$ is linearly independent;

Step 2: For this $H_y$, find the code length $n_1$ so that the sum of any two columns of $H_y$ is not zero; and Step 3: Again for this $H_y$, find the code length $n_2$ so that the sum of any three columns of $H_y$ is not zero.

Steps 2 and 3 are for double and triple error detection, respectively. Step 1 can be done by the Gauss-Jordan reduction as in the previous section. However, the number of computations for step 1 grows exponentially as the number of check bits increases, since the number of generator polynomials of degree n-k is $2_{n-k-1}$. Therefore, a more efficient method is needed.

A more efficient method for step 1 was originally devised for optimum burst correcting codes satisfying the Reiger bound. The efficiency is mainly due to the fact that the code length is determined based on the generator polynomial instead of parity polynomial and the number of computations also grows exponentially as the number of check bits increases. Notice that $H_y$ is a punctured parity check matrix.

Lemma 1

Every set of t consecutive columns of $H_y$ of a (shortened) cyclic code is linearly independent if and only if there is no code polynomial that can be written in the form of $$f(x)=e_1(x)+x^t e_2(x) \neq 0 \quad (28)$$

where $d(e_1) \leq t-1$, $d(e_2) \leq n-k-y-1$, $l \geq t$ and d(f) denotes the degree of polynomial f(x).

If $E_{g,b}$ denotes the set of all code polynomials in the form of equation 28 and $N(g,b)=\min_{f \in E_{g,b}} d(f)$, lemma 2 follows.

Lemma 2

Every set of t consecutive columns of $H_y$ of a shortened cyclic code is linearly independent if and only if $$n \leq N(g,b) \quad (29)$$

Then, we can deduce the following theorem.

Theorem 5

The following equation holds.

$$N(g,b)=L(M_g)+n-k \quad (30)$$

where $M_g$ is an infinite matrix which is defined as $$M_g = \begin{bmatrix} g_t & g_{t+1} & \cdots & g_{n-k} & 0 & 0 & \cdots \\ g_{t-1} & g_t & \cdots & g_{n-k-1} & g_{n-k} & 0 & \cdots \\ \cdot & g_{t-1} & & & g_{n-k-1} & g_{n-k} & \cdots \\ \cdot & \cdot & \cdot & & & & \\ \cdot & \cdot & \cdot & & & & \\ g_0 & \cdot & & & \cdot & & \\ 0 & g_0 & & & & & \\ 0 & 0 & & & & & \\ \cdot & \cdot & & & & & \\ \cdot & \cdot & & & & & \end{bmatrix} \quad (31)$$

and by letting $M_g^{(l)}$ be the matrix obtained as the intersection of the first l rows and the first l+y−t columns of $M_g$. Then, $L(M_g)$ is the largest of all the integers L such that for any l less than L+1, $$\text{rank of } M_g^{(l)} = l \quad (32)$$

The proof and the systematic way to compute $L(M_g)$ can be found in a paper entitled "Optimum Shortened Cyclic Codes for Burst Error Correction" (by T. Kasami, IEEE *Transactions on Information Theory*, pp 105–109, April 1963).

The shortened perfect codes are found by the above procedure and investigating the minimum distance of $H_y$ according to steps 2 and 3. The search range was for all the perfect codes of a rate greater than or equal to 0.6 (code length $n_1$) and satisfying $7 \leq t \leq 9$, for each number of check symbols up to 25. The perfect codes with the largest $n_1$ or $n_2$, and the large value on both $n_1$ and $n_2$ for each number of check symbols are in Table 3.

TABLE 3

| number of linear independent consecutive columns | number of check symbols | generator polynomial (octal) | $n_1$ | $n_2$ |
|---|---|---|---|---|
| 7 | 18 | 1252637 | 50 | 19 |
|   | 19 | 3446323 | 49 | 22 |
|   | 20 | 5266611 | 57 | x |
|   |    | 7622213 | 51 | 30 |
|   | 21 | 11545375 | 55 | 23 |
|   |    | 13331371 | 53 | 28 |
|   | 22 | 24677661 | 60 | 28 |
|   |    | 23602213 | 56 | 30 |
|   | 23 | 67231373 | 64 | 28 |
|   | 24 | 130620271 | 61 | 27 |
|   | 25 | does not exist |   |   |
| 8 | 20 | 7174513 | 59 | 29 |
|   |    | 6274665 | 50 | 33 |
|   | 21 | 11365477 | 58 | 22 |
|   |    | 11220523 | 53 | 31 |
|   | 22 | 34643555 | 64 | 24 |
|   |    | 25320637 | 59 | 36 |
|   | 23 | 64600641 | 66 | 31 |
|   |    | 65704661 | 63 | 34 |
|   | 24 | 146246711 | 69 | 31 |
|   |    | 140000631 | 66 | 39 |
|   | 25 | 206263567 | 74 | 28 |
|   |    | 211555425 | 66 | 41 |
|   |    | 336440445 | 68 | 39 |

TABLE 3-continued

| number of linear independent consecutive columns | number of check symbols | generator polynomial (octal) | $n_1$ | $n_2$ |
| --- | --- | --- | --- | --- |
|  |  | 234200437 | 66 | 40 |
| 9 | 23 | 56147313 | 80 | 32 |
|  |  | 75505037 | 63 | 43 |
|  |  | 57167311 | 70 | 40 |
|  | 24 | 124117325 | 77 | 37 |
|  |  | 174001341 | 62 | 40 |
|  |  | 156345017 | 66 | 39 |
|  | 25 | 247431007 | 78 | 45 |
|  |  | 344135027 | 77 | 40 |

It can be readily seen that if $n_2$ is used, the codes in Table 3 yield a rate which is too low. To find the high rate codes with $n_2$, the search range was changed for the perfect codes of a rate greater than or equal to 0.6 (code length $n_1$) and satisfying $11 \leq t \leq 12$, for 30 check symbols. The codes with large $n_1$, $n_2$, or both are shown in Table 4.

TABLE 4

| number of linear independent consecutive columns | number of check symbols | generator polynomial (octal) | $n_1$ | $n_2$ |
| --- | --- | --- | --- | --- |
| 11 | 30 | 16753107625 |  |  |
|  |  | 13034164231 | 97 | 52 |
|  |  | 15357774045 |  |  |
|  |  | 10374606311 | 75 | 71 |
|  |  | 14601207073 |  |  |
|  |  |  | 78 | 69 |
|  |  |  | 91 | 49 |
|  |  |  | 79 | 66 |
| 12 | 30 | 13437211065 |  |  |
|  |  | 10011110461 | 97 | 56 |
|  |  | 12163556265 |  |  |
|  |  | 16442172013 | 82 | 82 |
|  |  | 15644010013 |  |  |
|  |  |  | 82 | 82 |
|  |  |  | 92 | 60 |
|  |  |  | 92 | 57 |

Figure 5:
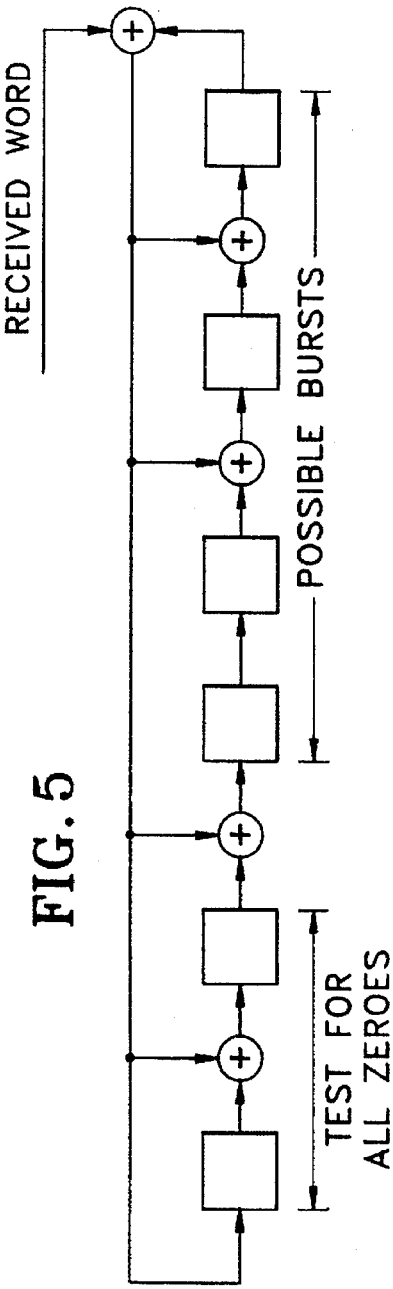

FIG. 5 shows part of a burst error trapping decoding circuit embodied when m=1 in a perfect code of class 5a, for explaining the merit of the present invention. In FIG. 5, the generator polynomial $g(x)=x^6+x^5+x^4+x^2+x+1$. Thus, the syndrome register portion is implemented as shown in FIG. 5. Here, the number of rows y of a sub-matrix of the parity check matrix $H_y$ is two. Accordingly, two syndrome bits are used to test all zeroes, and four syndrome bits are used to trap possible burst errors. Actually, considering decoding capability, the generator polynomial can be also obtained by squaring the given polynomial.

An example of the computer search program for the perfect code is as follows:

```
/* This program is to find the burst error detecting
   capability and minimum distance 4 for the shortened perfect
cyclic codes with deg(g(x)) < n_check+1 by Kasami method.
   */ include <stdio.h>
include <stdlib.h>
# define trace 1 /* trace 1 is the lowest option to print */
main()
{
   static int g[50], gr[50], inf[500], M_g[200][30], h[500];
   int i, j, k, m, deg_h=500, deg_g, k_inf, n_len, rate,
         n_row, w_test, posi, n_check, input[15], n_input;
   char name[30], c;

int z_bst, L_M_g, fr[30];

int max_length, carry;
   char decode, sh_cy, final='F';

FILE *fopen (), *fpw;
   fpw=fopen("tsol12.12", "w");

/*initialize
   for(j=0; j<=50; j++) g[j]=0;
     input[0]=1;
     printf(\n gen. poly. in octal ===");
     i=0;
     do{
       if(i!=0) n_input=i-1;
       j=getchar ();c=j;
       if (j !='\n' input[i++]=atoi(&c);
     } while (j!='\n');
     if (trace >=1) printpoly(input, n_input, "input");
     deg_g=inputconv(gr, input, n_input) ; reverse(gr, g,
deg_g);
     if (trace>=1) printpoly(g, deg_g, "g(x)");*/ n_row=12;
   w_test=12;

/*initialize*/
   for(j=0; j<=50; j++) g[j]=0;
   deg_g=30;
     g[0]=g[deg_g]=1;
```

```
            n_check = 30;
            printf("\n n_row = %d", n_row);
            printf("\n w_test = %d", w_test);

fprintf(fpw, "\n n_row = %d", n_row);
   5        fprintf(fpw, "\n w_test = %d", w_test);

do  {
               carry=1; j=0;
               while(carry==1)  {
  10              j++;
                  if(g[j]==1) {g[j]=0; carry=1;}
                  else {g[j]=1; carry=0;}
               }
               if(j>deg_g) {deg_g=j;
                  printf("\n\n # of check bits = %d", deg_g);
  15              fprintf(fpw, "\n\n # of check bits = %d", deg_g);} if (trace >= 2) flprintpoly(g, deg_g, "g(x) 1", fpw);

/* initial delimiting */
               z_bst =deg_g - w_test; L_M_g=0;
               if(g[z_bst]==1 && m1(g[z_bst-1], g[z_bst+1])!=1) {
  20
                  /* Form M_g */
                  for (i=0; i<=z_bst; i++) {
                     for (j=0; j<=w_test; j++) {
                        M_g[i][j]=g[z_bst-i+j];
                     }
  25              }

/* Do row operation until M_g[0][0]=0 */
                  final ='F';
                  do{
                   for(j=0;j<=w_test; j++) fr[j]=M_g[0][j];
  30               for(i=1; i<=z_bst; i++) {
                     if(M_g[i][0]==0) {
                        for(j=1; j<=w_test; j++)M_g[i-1][j-1]=M_g[i][j];
                     }
                      else {
  35                     for(j=1;j<=w_test; j++)M_g[i-1][j-1]
         =p1(M_g[i][j],fr[j]);
                       }
                   }

/* last row, last column */
  40               for(j=0; j<=w_test; j++) M_g[z_bst][j]=g[j];
                   for(i=0; i<=z_bst; i++) M_g[i][w_test]=g[deg_g-i];

/* Test final */
                   L_M_g++;
                   if (M_g[0][0]==0) final='T';
  45              } while(final=='F' && L_M_g<400);
```

```
            if(trace >= 2) printf("\n code length == %4d",
    L_M_g+deg_g);
            } k_inf=L_M_g; /* shortened information size */ if((float)(k_inf)/(float)(deg_g+k_inf))>=0.6) {
              /* output_oct(g, deg_g, fpw); */
              reverse(g, gr, deg_g); /*to use the high degree part*/

/* find corresponding h(x) */
              m=k_inf+w_test-1;
              inf[0]=1;    /*h[0] is always 1*/
              for(j=1; j<=m; j++) inf[j]=0;
              for(j=0; j<=m; j++) h[j]=0;
              j=0; final='F';
              while(final =='F' && j<=m) {
                if(inf[j] ==1) {
                  k=0;
                  h[j]=1;
                  for(i=j;i<=j+deg_g;i++) inf[i]=p1(inf[i],
    gr[i-j];
                  /* if (trace >=2) printpoly(inf, i-1, "inf");*/
                }
                j++;
                K++;
                if(k==deg_g) {
                  final='T'; sh_cy='F';
                  /*printf("primitive block length is %d \n",
    i-1);*/
                }
              }
              if (trace >=2) printpoly(h, deg_h, "h(x)");
              if (final=='F') sh_cy='T';

if(sh_cy=='T') {
                deg_h=m; /*for all cyclic codes, but in different
    form */
                if((float)(deg_h-w_test+1)/(float)
    (deg_g+feg_h-w_test+1)>=0.6){k=cut_more(h, deg_h, n_row, fpw);
                  /* k=cut_more_more(h, k, n_row, fpw); */ }
                if(k<deg_h) sh_cy='T';

if(k>w_test && (float)(k-w_test+1)/(float)
    (deg_g+k-w_test+1)>=0.6 {
                  if (trace >=1) {
                    flprintpoly (gr, deg_g, "g(x)", fpw);
                    output_oct(gr, deg_g, fpw);
                  }
                  deg_h=cut_more_more(h, k, n_row, fpw);
                  if(deg_h>w_test) fprintf(fpw, "--3 errors -
    %d", deg_h-w_test+1);
                  if(trace>=1) flprintpoly(h, k-w_test+1, "h(x)",
    fpw);

}
```

```
            }
          }
        } while(g[n_check+1]==0);
      }
      reverse(g, gr, deg_g)
      int *g, *gr, deg_g;
      {
        int i;
        for(i=0; i<=deg_g; i++) gr[i]=g[deg_g-i];
      } cut_more_more(h, deg_h, n_row, fpw)
      int *h, deg_h, n_row;
      FILE *fpw;
      {
        int i, j, k, wka[500], wkb[500], mdf_h, l, m;
        if(deg_h>=400) printf(*fpw, "dim. error in cut_more_more");
        mdf_h=deg_h;
          if (trace>=2) printpoly(h, deg_h, "h in cut_more_more");
        for(i=1; i<=mdf_h; i++) {
          for(j=0; j<=mdf_h; j++) wka[j]=h[j];
          for(j=i; j<=mdf_h; j++) wka[j]=pl(wka[j], h[j-i];
          for(k=i+1; k<=mdf_h; k++) {
            for(l=0; l<=mdf_h;l++) {if(l>,k)wkb[l]=pl(wka[l], h[l-k]); else wkb[l]=wka[l];
          }
          if(trace>=2) printpoly(wkb, mdf_h, "wkb in cut_more");
          m=posi_cons_0(wkb, mdf_h, n_row);
          if(m!=0) mdf_h=m-1;
          /*printf(" \n i==%d", i);
            printf("  k==%d  mdf==%d", k, mdf_h); */
        }
        return mdf_h;
      } cut_more(h, deg_h, n_row, fpw)
      int *h, deg_h, n_row;
      FILE *fpw;
      {
        int i, j, k, wk[500], mdf_h, l;
        if(deg_h>=400) printf(*fpw, "dim. error in cut_more");
        mdf_h=deg_h;
          if (trace>=2) printpoly(h, deg_h, "h in cut_more");
        for(i=1, i<=mdf_h; i++){
          for(j=0; j<=mdf_h; j++) wk[j]=h[j];
          for(j=i; j<=mdf_h; j++) wk[j]pl(wk[j], h[j-i]);
          k=mdf_h;
          if(trace >=2) printpoly(wk, k, "wk in cut_more");
          l=posi_cons_0(wk, k, n_row);
```

```
            if(l!=0) mdf_h=l-1;
                /* printf("   i== %d ",  i);
                   printf(" l==%d   mdf_h==%d ", l, mdf_h); */
            }
            return mdf_h;
        } posi_cons_0 (h, deg_h, cons)
        int *h, deg_h, cons;
        {
            int i=0, j, posi=0, length=0;
            char start='n', final='F';
            do  {
                if (start=='n'){
                    if (h[i]==0) {length=1; start='y';}
                }
                else{
                    if (h[i]==0) {length=length+1;}
                    else{
                        start='n';
                    }
                    if (length>=cons) {posi=i; final='T';}
                }
                i++;
            } while(i<=deg_h && final =='F');
            return posi;
        } inputconv (g, input, n_input)
        int *g, *input, n_input;
        {
            int i, j;
            for(i=n_input; i>=0; i--){
                if(input[i]==1||input[i]==3||input[i]==5||input[i]==7)
                    {g[(n_input-i)*3]=1; j=(n_input-i)*3;}
                if(input[i]==2||input[i]==3||input[i]==6||input[i]==7)
                    {g[(n_input-i)*3+1]=1; j=(n_input-i)*3+1;}
                if(input[i]==4||input[i]==5||input[i]==6||input[i]==7)
                    {g[(n_input-i)*3+2]=1; j=(n_input-i)*3+2;}
            }
            return j;
        } output_oct(g, deg_g, fpw)
        int *g, deg_g;
        FILE *fpw;
        {
            int i, n_oct, oct;
            n_oct=deg_g/3;
            g[deg_g+1]=g[deg_g+2]=0;
            fprintf(fpw, "   -- ");
```

```
        for(i=n_oct; i>=0; i--){
            oct=0;
            if(g[3*i]==1 oct=oct+1;
            if(g[3*i+1]==1 oct=oct+2;
            if(g[3*i+2]==1 oct=oct+4;
            fprintf(fpw, "%d", oct);
        }
    } flprintpoly(g, deg_g, name, fpw)
    int *g, deg_g;
    char name[30];
    FILE *fpw;
    {
        int i, j, rem, quo;
        fprintf(fpw, "\n *** %s *** degree=%d", name, deg_g);
        quo=deg_g / 50; rem=deg_g - 50*quo;
        for (i=0; i<=quo; i++) {
        fprintf(fpw, "\n %d ---", i*50);
        if(i==quo){
            for (j=0; j<=rem; j++) fprintf(fpw, "%d", g[i*50+j]);
            /* printf("\n"); */
        }
        else {
            for (j=0; j<=49; j++) fprintf(fpw, "%d", g[i*50+j]);
        }
        }
    } printpoly (g, deg_g, name)
    int *g, deg_g;
    char name[30];
    {
        int i, j, rem, quo;
        printf("\n *** %s *** degree=%d", name, deg_g);
        quo=deg_g / 50; rem =deg_g - 50*quo;
        for (i=0; i<=quo; i++) {
          printf(" \n %d ---", i*50);
          if (i==quo) {
             for (j=0; j<=rem; j++) printf("%d", g[i*50+j]);
             /* printf("\n"); */
          }
          else {
             for(j=0; j<=49; j++) printf("%d", g[i*50+j]);
          }
        }
    } printonly1(g, deg_g, name)
    int *g, deg_g;
    char name[30];
    {
        int j, m, n;
        /* printf("\n *** %s *** degree=%d", name, deg_g); */
```

56

```
        for (j=0; j<=deg_g; j++) {
          if (g[j] == 1) {
            m++;
            printf("%7d", j);
            /* if ((m % 5)== 0) printf("\n"); */
          }
        }
    }
    polymul(g1, deg_g1, g2, deg_g2, wk)
    int *g1, deg_g1, *g2, deg_g2, *wk;
    {
      int i, k, j;
      j=deg_g1 + deg_g2;

for (i=0, i<=j; i++) {
        wk[i]=0;
        for (k=0; k<=i; k++) {
          if (k<=deg_g1 && (i-k)<=deg_g2) wk[i]=p1(wk[i],
m1(g1[k], g2[i-k]));
        }
      }
      /* if(trace>=2) printpoly(g2, deg_g2, "g(x) in polmul");
      */ for(i=0; i<=j; i++) g1[i]=wk[i]; return j;
    } p1(a, b)
    int a, b;
    {
       if(a==b)
           return 0;
       else
           return 1;
    } m1(a, b)
    int a, b;
    {
       if(a==1 && b==1)
           return 1;
       else
           return 0;
    } power (a, b)
    int a, b;
    {
        int i, pwr=1;
        for(i=1; i<=b; i++) pwr=pwr*a;
        return pwr;
    }
```

As described above, this invention describes wide classes of cyclic codes that can correct almost all bursts up to twice the guaranteed correction bound. The decoding circuitry is a simple conventional burst trapping decoder. If we test much fewer syndrome bits than the conventional burst trapping method and implement the decoder according to the generator polynomials of the suggested codes, the desired results can be obtained. Prior work on decoding bursts beyond the guaranteed correctable bound did not show such a simple decoding.

The vector symbol approach yields the highest burst correcting capability since it uses long codes of bit length nr, where r should be 30 or so. If the length of a code is to be optimized, with good decoding results, the burst decoding capability should be decreased. For this purpose, wide classes of perfect burst correcting (shortened) cyclic codes are suggested, which can correct all bursts up to certain length and almost all bursts beyond that length. The perfect codes are highly amenable to mathematical analysis, and both the probability of incorrect decoding and the probability of undetected error are an exponentially decreasing function of the number of check bits that are tested to be zero.

One important aspect of the (shortened) perfect codes is that, by theorem 4, the parameter t of a code which is crucial to the burst correcting capability can be doubled by squaring the generator polynomial of the code, which happens to be the same operation as code interleaving. Thus, there are two options of decoding; (1) decoding according to the squared generator polynomial $g(x^2)$, with enhanced burst correcting capability; and (2) decoding according to two interleaved codewords, each encoded with the same generator polynomial $g(x)$, with the same burst correcting capability. These options will give additional freedom in designing the error correcting code with an interleaved structure.

As described above, the present invention can provide a simple burst error correcting cyclic code capable of extending burst error correction capability up to nearly twice the guaranteed correction bound. Also, the present invention can provide a burst error correcting cyclic code for simple burst error trapping decoding of almost all bursts of a predetermined length, which approaches twice the maximum guaranteed burst error correcting capability. On the other hand, although the embodiments of the present invention have been described only in connection with the simple burst error correcting cyclic codes, the generation methods and the burst error trapping decoder for the burst error trapping decoding method, it will be apparent to one skilled in the art that the present invention can be adapted in an encoder for an error correction through the minor modifications or variations.

What is claimed is:

1. A method for generating a burst error correcting cyclic code determined by a generator polynomial g(x) of an (n, k) cyclic code in which n is code length and k is the number of information bits, said method comprising the step of obtaining a predetermined value by adding one to the maximum number of consecutive zeros in a parity check polynomial, said predetermined value being the smallest integer such that a sub-matrix $p_1T$ of a parity check matrix does not have a column of all zeros for said generator polynomial of said (n, k) cyclic code.

2. A method for generating a burst error correcting cyclic code according to claim 1, wherein said predetermined value has a value selected from the group consisting of one to five.

3. A method for generating a burst error correcting cyclic code according to claim 1, wherein said (n, k) cyclic code is a binary code.

4. A method for generating a burst error correcting cyclic code according to claim 1, wherein said burst error correcting cyclic code is obtained by squaring said generator polynomial.

5. A method for generating a burst error correcting cyclic code according to claim 1, wherein burst error correction is performed with respect to nearly all bursts of length less than the number of the check bits from which said predetermined length is subtracted.

6. A method for generating a burst error correcting cyclic code determined by a generator polynomial g(x) of an (n, k) cyclic code in which n is code length and k is the number of information bits, said method comprising the step of obtaining a predetermined number t such that a set of t consecutive columns of a sub-matrix of a parity check matrix is linearly independent for said generator polynomial g(x) where the number of rows of the sub-matrix of the parity check matrix is a predetermined number y.

7. A method for generating a burst error correcting cyclic code according to claim 6, wherein said predetermined number y is confined to be less than the integer part of half of the number of check bits plus one.

8. A method for generating a burst error correcting cyclic code according to claim 6, wherein said cyclic code is a binary code.

9. A method for generating a burst error correcting cyclic code according to claim 6, wherein said burst error correcting cyclic code can be obtained by squaring said each generator polynomial.

10. A method for generating a burst error correcting cyclic code according to claim 6, wherein correction capability of said burst error correcting code is determined by said set of t linearly independent consecutive columns of each sub-matrix in each parity check matrix.

11. A method for generating a burst error correcting cyclic code according to claim 6, wherein all bursts of a length less than said set of linearly independent consecutive columns of each sub-matrix in each parity check matrix are corrected.

12. A method for generating a burst error correcting cyclic code according to claim 6, wherein almost all bursts of a length corresponding to one plus said set of t linearly independent consecutive columns of each sub-matrix in each parity check matrix, with an incorrect decoding probability which is less than or equal to $n2^{-(t-1)}$.

13. A method for generating a burst error correcting cyclic code according to claim 6, wherein almost all bursts of a length between two plus said set of t linearly independent consecutive columns of each sub-matrix in each parity check matrix and n–k–y, with an incorrect decoding probability which is less than or equal to $n2^{-t}$ where said number y is the number of rows of each sub-matrix in each parity check matrix.

14. A method for generating a burst error correcting cyclic code according to claims 6, wherein an undetected error probability is less than $n2^{31\ (t-1)}$ with respect to bursts having any length.

15. A method for generating a burst error correcting cyclic code determined by a generator polynomial g(x) of an (n–i, k–i) cyclic code in which n–i is code length, k–i is the number of information bits and i is the number of the shortened bits, comprising the step of determining a value of said code length n–i so that every set of a predetermined number of consecutive columns of a sub-matrix of a parity check matrix is linearly independent for said generator polynomial g(x).

16. A method for generating a burst error correcting cyclic code according to claim 15, further comprising the step of obtaining a second code length for said sub-matrix of the parity check matrix so that the sum of any two columns of said sub-matrix of the parity check matrix is not zero.

17. A method for generating a burst error correcting cyclic code according to claim 16, further comprising the step of obtaining a third code length for said sub-matrix of the parity check matrix so that the sum of any three columns of said sub-matrix of the parity check matrix is not zero.

18. A burst error trapping decoder comprising a syndrome register portion for forming a syndrome s(X) and a buffer register portion for storing an information digit, both of which receive an input vector r(X), so as to correct a burst error e(X) using a burst-error-correcting (n, k) cyclic code when y stages which are obtained by adding one to the maximum number of the consecutive zeroes in a sub-matrix of a parity check matrix contain all zeroes in which n is the total length of the cyclic code and k is the number of information bits, said burst error trapping decoder comprising the improvement wherein said syndrome register portion comprises a plurality of serially connected feedback shift registers of which the feedback connection tap points are determined by using a simple burst error correcting cyclic code having a predetermined value which is obtained by adding one to the maximum number of consecutive zeros in a parity check polynomial, said predetermined value being the smallest integer such that a sub-matrix $p_1T$ of a parity check matrix does not have a column of all zeros.

19. A burst error trapping decoder according to claim 18, wherein said burst error correcting cyclic code can be obtained by squaring said generator polynomial.

20. A burst error trapping decoder according to claim 18, wherein burst error correction is performed with respect to nearly all bursts of length less than the number of the check bits from which said predetermined length is subtracted.

21. A burst error trapping decoder according to claim 18, wherein said predetermined value has a value of one to five.

22. A burst error trapping decoder according to claim 21, wherein said predetermined value has a value of one or two desirably.

23. A burst error trapping decoder comprising a syndrome register portion for forming a syndrome s(X) and a buffer register portion for storing an information digit, both of which receive an input vector r(X), so as to correct a burst error e(X) using a burst-error-correcting (n, k) cyclic code when y stages contain all zeroes in which y is the number of rows of a sub-matrix of a parity check matrix, n is the total length of the cyclic code and k is the number of information bits, said burst error trapping decoder comprising the improvement wherein said syndrome register portion comprises a plurality of serially connected feedback shift registers of which the feedback connection tap points are determined by using a simple burst error correcting code having a predetermined value t so that a set of t consecutive columns of a sub-matrix of a parity check matrix is linearly independent for said generator polynomial g(x).

24. A burst error trapping decoder according to claim 23, wherein said predetermined value y is confined to be less than the integer part of half of the number of check bits plus one.

25. A burst error trapping decoder according to claim 23, wherein said burst error correcting cyclic code can be obtained by squaring said generator polynomial.

26. A burst error trapping decoder according to claims 23, wherein an undetected error probability is less than $n2^{-(t-1)}$ with respect to bursts having any length.

27. A burst error trapping decoder according to claim 23, wherein correction capability said burst error correcting code is determined by the number of said linearly independent consecutive columns of each sub-matrix in each parity check matrix.

28. A burst error trapping decoder according to claim 27, wherein all bursts of a length less than said set of t linearly independent consecutive columns of each sub-matrix in each parity check matrix are corrected.

29. A burst error trapping decoder according to claim 27, wherein almost all bursts of a length corresponding to one plus said set of t linearly independent consecutive columns of each sub-matrix in each parity check matrix, with an incorrect decoding probability which is less than or equal to $n2^{-(t-1)}$.

30. A burst error trapping decoder according to claim 27, wherein almost all bursts of a length between two plus said set of t linearly independent consecutive columns of each sub-matrix in each parity check matrix and n–k–y, with an incorrect decoding probability which is less than or equal to $n2^{-t}$ where said number y is the number of rows of each sub-matrix in each parity check matrix.

31. A burst error trapping decoder comprising a syndrome register portion for forming a syndrome s(X) and a buffer register portion for storing an information digit, both of which receive an input vector r(X), so as to correct a burst error e(X) using a burst-error-correcting (n–i, k–i) cyclic code when y stages contain all zeroes in which y is the number of rows of a sub-matrix of a parity check matrix, n–i is the total length of the cyclic code and k–i is the number of information bits and i is the number of shortened bits, said burst error trapping decoder comprising the improvement wherein said syndrome register portion comprises a plurality of serially connected feedback shift registers of which the feedback connection tap points are determined by using a burst error correcting code determined by a generator polynomial g(x) of said (n–i, k–i) cyclic code, said burst error correcting cyclic code having code length n–i so that every set of a predetermined number t of consecutive columns of a parity check matrix is linearly independent for said generator polynomial g(x).

32. A burst error trapping decoder according to claim 31, wherein said code length is determined by obtaining a second code length for said sub-matrix of the parity check matrix so that the sum of any two columns of said sub-matrix of the parity check matrix is not zero.

33. A burst error trapping decoder according to claim 31, wherein said code length is determined by obtaining a third code length for said sub-matrix of the parity check matrix so that the sum of any three columns of said sub-matrix of the parity check matrix is not zero.

34. A burst error trapping decoder comprising:

a syndrome register means for forming a syndrome s(X), said syndrome register means having a plurality of serially connected feedback shift registers of which the feedback connection tap points are determined by using a simple burst error correcting cyclic code having a predetermined value which is obtained by adding one to the maximum number of consecutive zeros in a parity check polynomial, said predetermined value being the smallest integer such that a sub-matrix $p_1T$ of a parity check matrix does not have a column of all zeros among each generator polynomial of said cyclic code; and a buffer register means for storing an information digit; both said syndrome register means and said buffer register means are capable of receiving an input vector r(X), so as to correct a burst error e(X) using a burst-error-correcting (n, k) cyclic code when y stages which are obtained by adding one to the maximum number of the consecutive zeroes in a sub-matrix of a parity check matrix contain all zeroes in which n is the total length of the cyclic code and k is the number of information bits.

* * * * *

UNITED STATES PATENT AND TRADEMARK OFFICE
CERTIFICATE OF CORRECTION

PATENT NO. : 5,657,331
DATED : August 12, 1997
INVENTOR(S) : John J. Metzner et al.

It is certified that error appears in the above-identified patent and that said Letters Patent is hereby corrected as shown below:

Column 11, line 15, there should be a space between "1" and "in".
Column 12, line 25, insert --(ii) $n/4 = 4k+2$--.
Column 12, line 33, insert --(iii) $n/4 = 4k+3$--.
Column 16, line 55, "$_t+1$," should be --$^t+1$,--.
Column 18, line 24, "$g(x1)=(ix^{n/3}+1)(x^4+x^3+1)/(x+1)$" should be --$g(x)=(x^{n/3}+1)(x^4+x^3+1)/(x+1)$--.
Column 33, line 9, "245224523" should be --145224523--.
Column 52, line 31, insert --t-- between "of" and "linearly".
Column 52, line 47, "claims" should be --claim--.
Column 52, line 48, "$n2^{31\ (t-1)}$" should be --$n2^{-(t-1)}$--.

Signed and Sealed this

Sixth Day of July, 1999

Q. TODD DICKINSON

*Attest:*

*Attesting Officer*      Acting Commissioner of Patents and Trademarks